(12) United States Patent
Cheng et al.

(10) Patent No.: US 12,170,116 B2
(45) Date of Patent: Dec. 17, 2024

(54) OPERATING METHOD FOR A MEMORY, A MEMORY AND A MEMORY SYSTEM

(71) Applicant: Yangtze Memory Technologies Co., Ltd., Hubei (CN)

(72) Inventors: Boxuan Cheng, Hubei (CN); Lu Guo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 150 days.

(21) Appl. No.: 18/090,104

(22) Filed: Dec. 28, 2022

(65) Prior Publication Data

US 2024/0135998 A1 Apr. 25, 2024
US 2024/0233834 A9 Jul. 11, 2024

(30) Foreign Application Priority Data

Oct. 20, 2022 (CN) .......................... 202211288018.7

(51) Int. Cl.
*G11C 16/28* (2006.01)
*G11C 16/04* (2006.01)

(52) U.S. Cl.
CPC .......... *G11C 16/28* (2013.01); *G11C 16/0483* (2013.01)

(58) Field of Classification Search
None
See application file for complete search history.

(56) References Cited

U.S. PATENT DOCUMENTS

2016/0372161 A1* 12/2016 Chae ................. H03M 13/6325
2022/0336023 A1* 10/2022 Muchherla ........... G11C 16/102
2023/0099349 A1* 3/2023 Cadloni ................ G11C 16/26
714/54

* cited by examiner

*Primary Examiner* — Tan T. Nguyen
(74) *Attorney, Agent, or Firm* — Oblon, McClelland, Maier & Neustadt, L.L.P.

(57) ABSTRACT

A method for operating a memory is provided, including, for example, obtaining a set of read voltages, each of which can include an initial voltage value and an offset voltage value with a certain offset relative to the initial voltage value. The initial voltage value in each of the set of read voltages can be a preset read voltage for distinguishing two adjacent memory states of memory cells of the memory. The operating method can further include performing read operations respectively based on the initial voltage values and the offset voltage values, obtaining the quantity of memory cells in which a read result corresponding to each voltage value meets set conditions, determining a difference between the two quantities corresponding to every two adjacent voltage values belonging to the same set of read voltages, and determining an optimal read voltage for distinguishing the two adjacent memory states based on the difference.

20 Claims, 11 Drawing Sheets

OPERATING METHOD FOR A MEMORY, A MEMORY AND A MEMORY SYSTEM

CROSS-REFERENCE OF RELATED APPLICATIONS

The present application claims the benefit of priority to China Application No. 202211288018.7, filed on Oct. 20, 2022, the content of which is incorporated herein by reference in its entirety.

TECHNICAL FIELD

The present disclosure relates to the technical field of memory, and in particular to an operating method for a memory, a memory, and a memory system.

BACKGROUND

Recently, with the development of memory, a memory can be volatile or nonvolatile. The nonvolatile memory is capable of holding data even when powered down, and thus it has been widely used in cellular phones, digital cameras, personal digital assistants, mobile computing devices, non-mobile computing devices and other devices, especially 3D NAND flash memory applications being widespread. The 3D NAND flash memory realizes the function of data storage by capturing and storing charges in the gate dielectric layer of the memory cells contained therein. However, with the time increasing for storage, the charge in the gate dielectric layer of the memory cell will leak slowly. When the memory cell is read repeatedly, the charge of the gate dielectric layer of the memory cell will be captured, similar to programming. In any case, a change in the charge of the gate dielectric layer of the memory cell causes a change in the threshold voltage of the memory cell, thereby affecting the correctness of reading the stored data of the memory cell.

SUMMARY

In view of this, the present disclosure provides an operating method for a memory, a memory, and a memory system to solve some technical problems.

In order to achieve the above objects, the technical solution of the present disclosure is realized as follows.

In the first aspect, embodiments of the present disclosure provide an operating method for a memory, including:

obtaining at least one set of read voltages, each of the at least one set of read voltages including an initial voltage value and an offset voltage value with a certain offset relative to the initial voltage value, the initial voltage value in each of the at least one set of read voltages being a preset read voltage for distinguishing two adjacent memory states of the memory cells of the memory;

performing read operations respectively based on the initial voltage values and the offset voltage values in the at least one set of read voltages, and obtaining the quantity of memory cells in which read result corresponding to each voltage value meets set conditions:

determining a difference between the two quantities corresponding to every two adjacent voltage values belonging to the same set of read voltages; and determining an optimal read voltage for distinguishing the two adjacent memory states based on the difference.

In the second aspect, embodiments of the present disclosure also provide a memory, including: a memory array that includes memory cells; and a peripheral circuit coupled to the memory array and configured to control the memory array, wherein the peripheral circuit can be configured to perform the above-mentioned method.

In the third aspect, embodiments of the present disclosure also provide a memory system, including one or more of the memories mentioned above and a memory controller coupled to the memory. The memory controller can be configured to send a first command to the memory. The memory can be configured to perform the above-mentioned method in response to the first command.

In the fourth aspect, embodiments of the present disclosure also provide a memory system, including one or more memories, and a memory controller coupled to the memory.

In an embodiment, the memory controller can be configured to obtain at least one set of read voltages, each of the at least one set of read voltages can include an initial voltage value and an offset voltage value with a certain offset relative to the initial voltage value, and the initial voltage value in each of the at least one set of read voltages can be a preset read voltage for distinguishing two adjacent memory states of the memory cells of the memory. In another embodiment, the memory controller can be further configured to send a corresponding read command to a memory plane contained in the memory respectively based on the initial voltage value and the offset voltage value in the at least one set of read voltages.

In some embodiments, the memory can be configured to read a corresponding memory plane in response to the corresponding read command, and send a reading result of each of memory cells in the memory plane to the memory controller.

In various embodiments, the memory controller can be further configured to receive the reading result; count the quantity of memory cells in which reading result corresponding to each voltage value meets the set conditions, determine a difference between the two quantities corresponding to every two adjacent voltage values belonging to the same set of read voltages, and determine an optimal read voltage for distinguishing the two adjacent memory states based on the difference.

In the fifth aspect, embodiments of the present disclosure also provide a memory system, including one or more memory and a memory controller coupled to the memory.

In an embodiment, the memory controller can be configured to obtain at least one set of read voltages, each of the at least one set of read voltages can include an initial voltage value and an offset voltage value with a certain offset relative to the initial voltage value, and the initial voltage value in each set of read voltages can be a preset read voltage for distinguishing two adjacent memory states of the memory cells of the memory. In another embodiment, the memory controller can be further configured to send a corresponding read command to a memory plane contained in the memory respectively based on an initial voltage value and an offset voltage value in the at least one set of read voltages.

In some embodiments, the memory can be configured to read a corresponding memory plane in response to the corresponding read command, count the quantity of memory cells in which reading result corresponding to each voltage value meets the set conditions, and send the quantity to the memory controller.

In various embodiments, the memory controller can be further configured to receive the quantity, determine a difference between the two quantities corresponding to every two adjacent voltage values belonging to the same set of read voltages, and determine an optimal read voltage of the memory cells for distinguishing the two adjacent memory states based on the difference.

Embodiments of the present disclosure provide an operating method for a memory, a memory and a memory system. For example, the operating method for a memory can include obtaining at least one set of read voltages, each of the at least one set of read voltages including an initial voltage value and an offset voltage value with a certain offset relative to the initial voltage value, the initial voltage value in each of the at least one set of read voltages being a preset read voltage for distinguishing two adjacent memory states of the memory cells of the memory. The operating method can further include performing read operations respectively based on the initial voltage values and the offset voltage values in the at least one set of read voltages, obtaining the quantity of memory cells in which read result corresponding to each voltage value meets the set conditions; determining a difference between the two quantities corresponding to every two adjacent voltage values belonging to the same set of read voltages, and determining an optimal read voltage for distinguishing the two adjacent memory states based on the difference. The operating method for a memory provided by embodiments of the present disclosure respectively can execute the read operations on the memory cells of the memory with every voltage value by setting at least one set of read voltages containing a plurality of voltage values, and obtain the quantity of memory cells in which reading results meeting the set conditions. Then, an optimal read voltage for distinguishing two adjacent memory states of memory cells of a memory corresponding to the set of read voltages is determined based on the difference between the quantities corresponding to every two adjacent voltage values belonging to the same set of read voltages. The corresponding memory cell of the memory is read with the obtained optimal read voltage, thus greatly increasing the probability of correctly reading the data stored in the memory cells.

BRIEF DESCRIPTION OF THE DRAWINGS

Aspects of the present disclosure can be best understood from the following description of specific embodiments when reading in conjunction with the accompanying drawings. Note that various features are not drawn to scale according to the standard practice of industry aggregation. In fact, for the sake of clarity of discussion, the size of each feature can be increased or decreased at will.

DETAILED DESCRIPTION

The following disclosure provides many different embodiments or examples for implementing different features of the presented subject matter. Specific examples of components and arrangements are described below to simplify the present disclosure. Of course, these are examples only, not limiting. For example, in the following description, a first feature formed on or over a second feature may include embodiments in which the first feature and the second feature are formed in direct contact, and may also include embodiments in which additional features may be formed between the first feature and the second feature to make them not be in direct contact. Additionally, the reference data and/or letters may be repeated in various instances of the present disclosure. Such repetition is for the sake of simplicity and clarity and does not in itself indicate the relationship between various embodiments and/or structures discussed.

In addition, spatially relative terms such as "under", "beneath", "lower", "above", "upper" and the like may be used herein to describe the relationship between an element or feature and (one and more) another element or feature as shown in the figures, for convenience of description. Spatially relative terms are intended to encompass different orientations of the device in use or operation in addition to the orientations depicted in the figures. The device may be otherwise oriented (rotated 90 degrees or at other orientations) and the spatially relative descriptors used herein can also be interpreted accordingly.

The technical solution of the present disclosure will be described in detail below in conjunction with the accompanying drawings.

Figure 1:
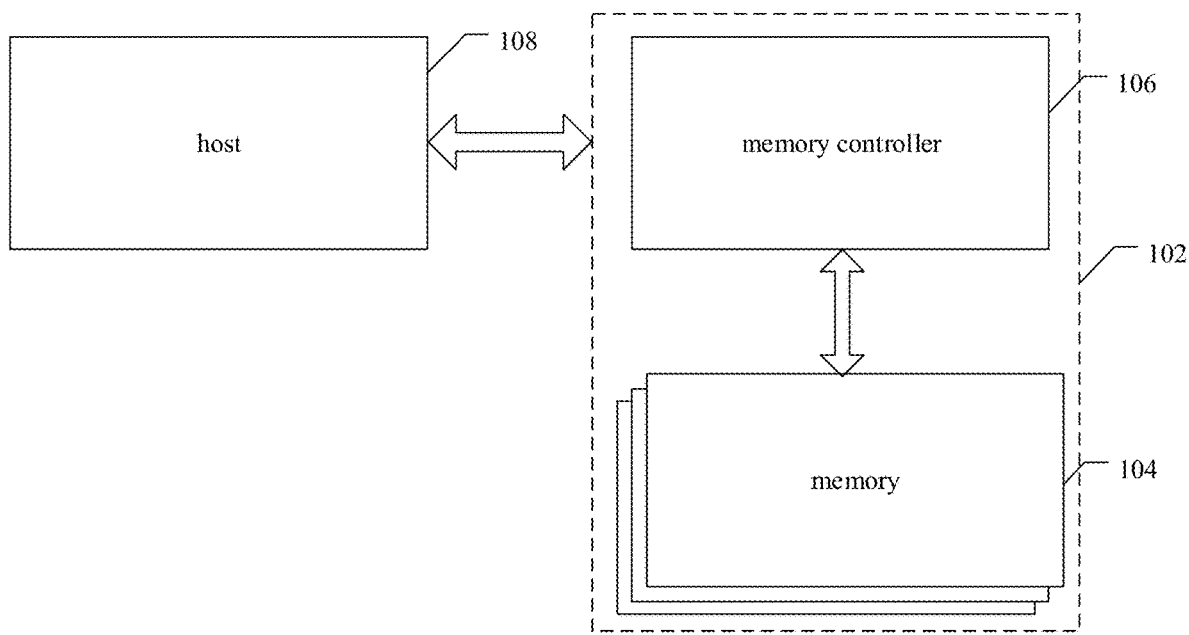
FIG. 1 shows a block diagram of an exemplary system having memories.

FIG. 1 shows a block diagram of an exemplary system 100 with a memory. In FIG. 1, the system 100 may be a mobile phone, a desktop, a laptop, a tablet, a vehicle computer, a game console, a printer, a positioning device, a wearable electronic device, a smart sensor, a virtual reality (VR) device, an augmented reality (AR) device, or any other suitable electronic device having a memory therein. As shown in FIG. 1, the system 100 may include a host 108 and a memory system 102. The memory system 102 has one or more memories 104 and a memory controller 106. The host 108 may be a processor of an electronic device, such as a central processing unit (CPU) or a system on chip (SoC). The system on chip may be, for example, an application processor (AP). The host 108 may be configured to send data to or receive data from memory 104. Specifically, memory 104 may be any memory disclosed in the present disclosure, such as phase change random access memory (PCRAM), three-dimensional NAND flash memory, and so on.

According to some implementations, memory controller 106 is coupled to memory 104 and host 108, and is configured to control the memory 104. Memory controller 106 may manage data stored in memory 104 and communicate with host 108. In some embodiments, memory controller 106 is designed to operate in low duty cycle environment, such as in a secure digital (SD) card, a compact flash (CF) card, a universal serial bus (USB) flash driver, or other media used in electronic devices in low duty cycle environments such as personal calculators, digital cameras, mobile phones, etc. In some embodiments, memory controller 106 is designed to operate in high duty cycle environment, such as a solid state drive (SSD) or an embedded multimedia card (eMMC), where SSD or eMMC is used as data memory and enterprise memory arrays for mobile devices in high duty cycle environments such as smartphones, tablets, laptops, and so on. Memory controller 106 may be configured to control operations of memory 104, such as read, erase and program operations. Memory controller 106 may also be configured to manage various functions related to data stored or to be stored in memory 104, including but not limited to bad block management, garbage collection, logical-to-physical address translation, wear leveling, and the like. In some implementations, memory controller 106 is further configured to process error correction code (ECC) on data read from or written to memory 104. Memory controller 106 may also perform any other suitable functions, such as formatting memory 104. Memory controller 106 may communicate with external devices (e.g., host 108) according to a particular communication protocol. For example, memory controller 106 can communicate with external devices through at least one of various interface protocols, such as USB protocol, MMC protocol, peripheral component interconnection (PCI) protocol, PCI Express (PCI-E) protocol, advanced technology attachment (ATA) protocol, serial ATA protocol, parallel ATA protocol, small computer small interface (SCSI) protocol, enhanced small disk interface (ESDI) protocol, integrated drive electronics (IDE) protocol, Firewire protocol, etc.

Figure 2:
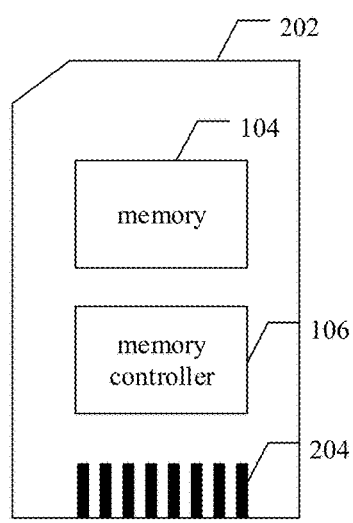
FIG. 2 shows a schematic diagram of an exemplary memory card with a memory.
Figure 3:
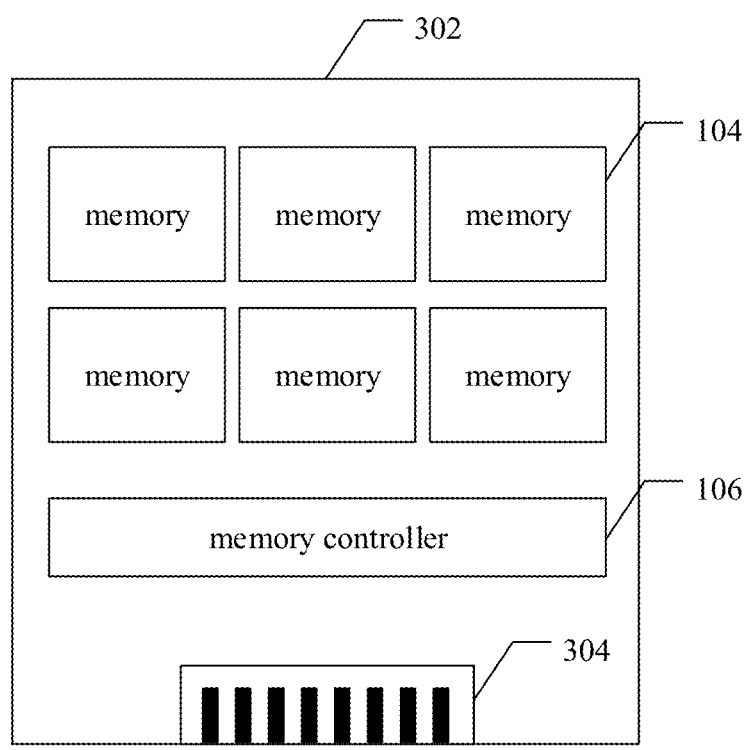
FIG. 3 shows a schematic diagram of an exemplary solid-state disk (SSD) with memories.

Memory controller 106 and one or more memories 104 may be integrated into various types of storage devices, for example including in the same package, such as a universal flash storage (UFS) package or an eMMC package. That is, memory system 102 may be implemented and encapsulated into different types of terminal electronics. In an example as shown in FIG. 2, memory controller 106 and a single memory 104 may be integrated into memory card 202. Memory card may include a PC card (PCMCIA, Personal Computer Memory Card International Association), a CF card, a smart media (SM) card, a memory stick, a multimedia card (MMC, RS-MMC, MMCmicro), an SD card (SD, miniSD, microSD, SDHC), a UFS, and the like. Memory card may also include memory card connector 204 that couples the memory card with a host (e.g. host 108 in FIG. 1). In another example as shown in FIG. 3, memory controller 106 and a plurality of memories 104 may be integrated into the SSD 302. SSD may also include SSD connector 304 that couples SSD with a host (e.g. host 108 in FIG. 1). In some implementations, the storage capacity and/or operating speed of SSD is greater than that of memory card. In addition, memory controller 106 may be configured to control the erase, read, write operation of memory 104.

Figure 4:
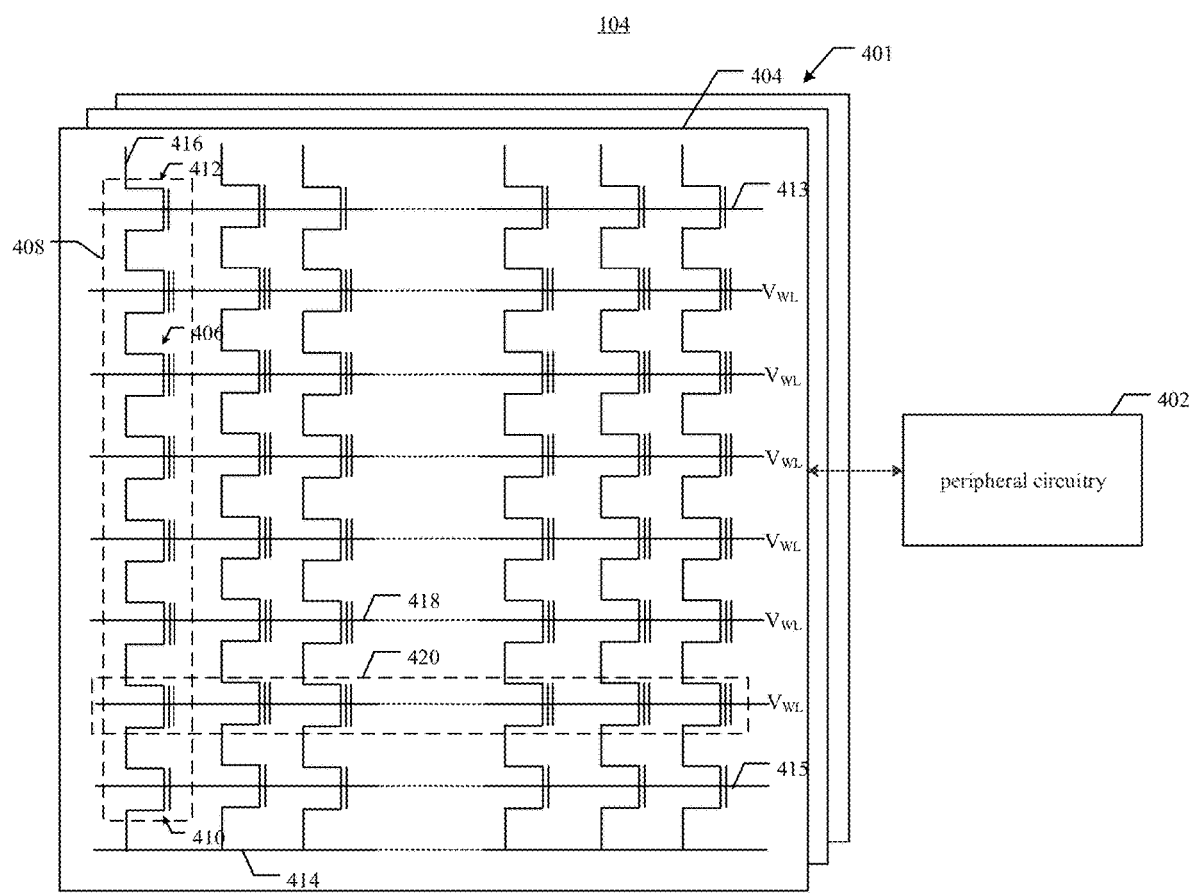
FIG. 4 shows a schematic diagram of an exemplary memory including peripheral circuits.

FIG. 4 shows a schematic diagram of an exemplary memory including peripheral circuit. Memory 104 shown in FIG. 4 may include a memory array 401, which may be a NAND flash memory array, and a peripheral circuit 402 coupled to memory array 401. Memory cells 406 are provided in the form of an array of NAND memory strings 408, each NAND memory string 408 extending vertically over a substrate (not shown). In some embodiments, each NAND memory string 408 includes a plurality of memory cells 406 coupled in series and stacked vertically. Each memory cell 406 may maintain a continuous analog value, such as voltage or charge, which depends on the quantity of electrons captured within the storage area of the memory cell 406. Each memory cell 406 may be memory cell of floating gate type including a floating gate transistor or memory cell of charge trap type including a charge trap transistor.

In some embodiments, each memory cell 406 is a single level cell (SLC) with two possible memory states and thus can store one bit of data, for example, first memory state of "0" may correspond to first voltage range, and second memory state of "1" may correspond to second voltage range. In some embodiments, each memory cell 406 is a multi-level cell (MLC) with four or more memory states. For example, MLC may store two bits per cell, store three bits per cell (also known as a trinary level cell (TLC)), or store four bits per cell (also known as a quadruple level cell (QLC)). It should be noted that the memory state mentioned here is the memory state of memory cells mentioned in the present disclosure. Different types of memory cells have different quantities of memory states, for example, memory cell of SLC type has 2 memory states (that is, two memory states), wherein these 2 memory states include: a programming state and an erasing state. As another example, memory cell of MLC type has 4 memory states, wherein these 4 memory states include: an erasing state and three programming states. As still another example, memory cell of TLC type has 8 memory states, wherein these 8 memory states include: an erasing state and seven programming states. In some embodiments, memory cell of QLC type has 16 memory states, wherein these 16 memory states include: an erasing state and fifteen programming states.

As shown in FIG. 4, each NAND memory string 408 may include a source select gate (SSG) 410 at its source terminal and a drain select gate (DSG) 412 at its drain terminal. SSG 410 and DSG 412 may be configured to activate selected NAND memory strings 408 (columns of the array) during read and program (or write) operations. In some embodiments, the sources of the NAND memory strings 408 in the same block 404 are coupled by the same source line (SL) 414 (e.g., a common SL). In other words, according to some implementations, all NAND memory strings 408 in the same block 404 have an array common source (ACS). According to some implementations, the DSG 412 of each NAND memory string 408 is coupled to a corresponding bit line 416 from which data can be read and written via an output bus (not shown). In some embodiments, each NAND memory string 408 is configured to be selected or deselected by applying a select voltage (e.g., above the threshold voltage of the transistor with DSG 412) or a deselect voltage (e.g., 0 volts (V)) to the corresponding DSG 412 via one or more DSG lines 413 and/or by applying a select voltage (e.g., higher than the threshold voltage of a transistor with SSG 410) or a deselect voltage (e.g., 0 V) to the corresponding SSG 410 via one or more SSG lines 415.

As shown in FIG. 4, the NAND memory string 408 may be organized into a plurality of blocks 404, each of which may have a common source line 414 (e.g. coupled to ground). In some embodiments, each block 404 is a basic data unit with an erase operation, i.e., all memory cells 406 on the same block 404 are erased simultaneously. In order to erase the memory cells 406 in the selected block 404, the memory cell may be biased couple to source line 414 of the selected block 404 and the unselected block 404 in the same plane as the selected block 404 with the erase voltage (Vers) (such as a high positive voltage of 20V or higher). It should be understood that in some examples the erase operation may be performed at the half-block level, at a quarter-block level, or at a level having any suitable number of blocks or any suitable fraction of blocks. The memory cells 406 of adjacent NAND memory strings 408 may be coupled by word line 418 that select which row of memory cells 406 receives the read and program operations. In some implementations, the memory cells 406 coupled to the same word line 418 are referred to as (physical) pages 420. Page 420 is a basic unit of data for programming or reading operations. The size of a page 420 in bits may be related to the quantity of NAND memory strings 408 coupled by word lines 418 in a block 404. Each word line 418 may include a plurality of control gates (gate electrodes) and gate lines coupling the control gates at each memory cell 406 in a respective page 420.

Figure 5:
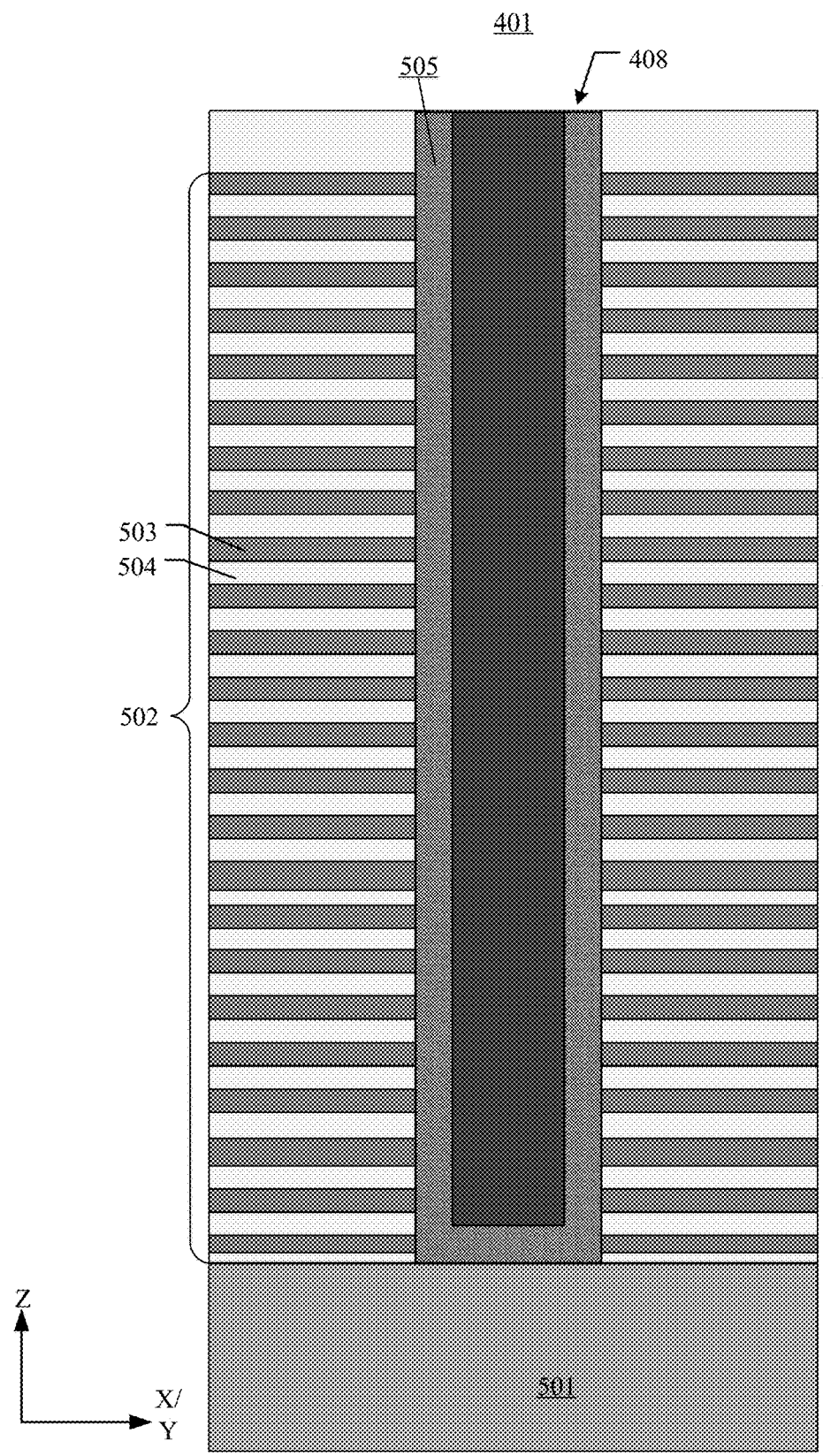
FIG. 5 shows a cross-sectional side view of an exemplary memory array including NAND memory strings.

FIG. 5 illustrates a cross-sectional side view of an exemplary memory array 401 including an NAND memory cell string 408 in accordance with some aspects of the present disclosure. The NAND memory cell string 408 as shown in FIG. 5 may extend vertically over the substrate 501 through the memory stack layer 502. The substrate 501 may include silicon (e.g. monocrystalline silicon), silicon germanium (SiGe), gallium arsenide (GaAs), germanium (Ge), silicon on insulator (SOI), germanium on insulator (GOI), or any other suitable material.

The memory stack layer 502 may include alternating gate conductive layers 503 and gate-to-gate dielectric layers 504. The quantity of the pairs of gate conductive layer 503 and gate-to-gate dielectric layer 504 in memory stack layer 502 may determine the quantity of memory cells 406 in memory array 401. The gate conductive layer 503 may include conductive materials including but not limited to tungsten (W), cobalt (Co), copper (Cu), aluminum (Al), polysilicon, doped silicon, silicide or any combination thereof. In some implementations, each gate conductive layer 503 includes a metal layer, such as a tungsten layer. In some implementations, each gate conductive layer 503 includes a doped polysilicon layer. Each gate conductive layer 503 may include a control gate surrounding the memory cell 406, and may extend laterally at the top of the memory stack layer 502 as a DSG line 413 and at the bottom of the memory stack layer 502 as a SSG line 415, or extend laterally between the DSG line 413 and the SSG line 415 as a word line 418.

As shown in FIG. 5, NAND memory cell string 408 includes a channel structure 505 extending vertically through memory stack layer 502. In some implementations, the channel structure 505 includes a channel hole filled with a semiconductor material(s) and a dielectric material(s). In some implementations, the semiconductor channel includes silicon, e.g., polysilicon. In some implementations, the memory film is a composite dielectric layer including a tunneling layer, a storage layer (also referred to as a "charge trapping/storage layer") and a blocking layer. The channel structure 505 may have a cylindrical shape (e.g., a pillar shape). According to some implementations, the semiconductor channel, the tunneling layer, the storage layer and the block layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The block layer may include silicon oxide, silicon oxynitride, a high-k dielectric, or any combination thereof. In one example, the memory film may include a composite layer of silicon oxide/silicon oxynitride/silicon oxide (ONO).

Figure 6:
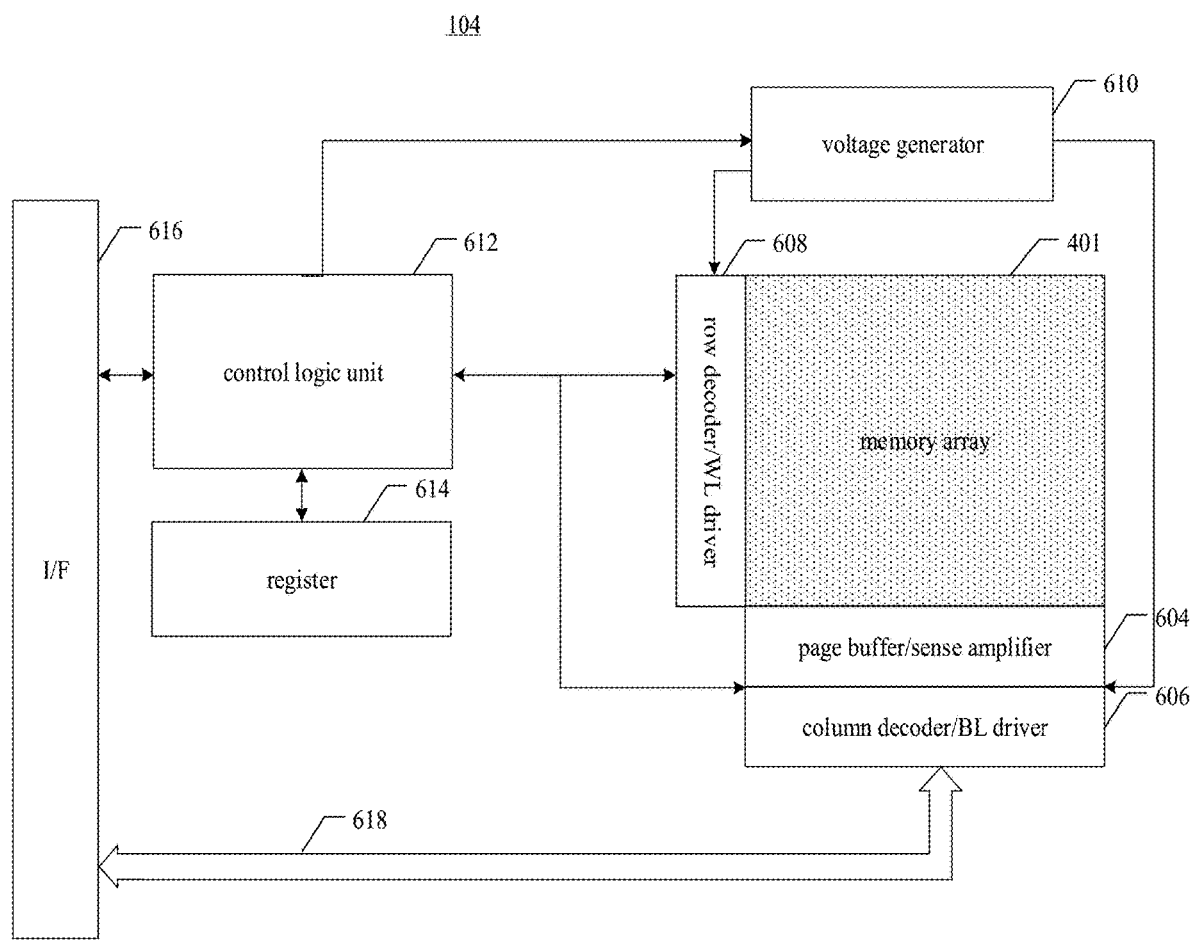
FIG. 6 shows a block diagram of an exemplary memory including a memory array and peripheral circuits.

Referring back to FIG. 4, the peripheral circuit 402 may be coupled to memory array 401 via bit line 416, word line 418, source line 414, SSG line 415 and DSG line 413. The peripheral circuit 402 may include any suitable analog, digital and mixed-signal circuitry for facilitating operation of memory array 401 by applying/sensing voltage and/or current signals to/from each target memory cell 406 via bit lines 416, word lines 418, source lines 414, SSG lines 415 and DSG lines 413. The peripheral circuit 402 may include various types of peripheral circuits formed using metal-oxide-semiconductor (MOS) technology. For example, FIG. 6 shows some exemplary peripheral circuit. The peripheral circuit 402 includes a page buffer/sense amplifier 604, a column decoder/bit line driver 606, a row decoder/word line driver 608, a voltage generator 610, a control logic unit 612, a register 614, an interface 616, and a data bus 618. It should be understood that additional peripheral circuit not shown in FIG. 7 may also be included in some examples.

The page buffer/sense amplifier 604 may be configured to read data from and program (write) data to the memory array 401 in accordance with a control signal from the control logic unit 612. In one example, the page buffer/sense amplifier 604 may store one page of programming data (writing data) to be programmed into one page 420 of the memory array 401. In another example, the page buffer/sense amplifier 604 may perform a program verification operation to ensure that data has been correctly programmed into the memory cell 406 coupled to the selected word line 418. In yet another example, the page buffer/sense amplifier 604 may also sense a low power signal from the bit line 416 representing the data bits stored in the memory cell 406, and amplify the small voltage swing to a recognizable logic level during a read operation. The column decoder/bit line driver 606 may be configured to be controlled by the control logic unit 612, and to select one or more NAND memory strings 408 by applying a bit line voltage generated from the voltage generator 610.

The row decoder/word line driver 608 may be configured to be controlled by the control logic unit 612, and to select/deselect the block 404 of the memory array 401 and t the word line 418 of the block 404. The row decoder/word line driver 608 may also be configured to drive the word line 418 using the word line voltage generated from the voltage generator 610. In some implementations, the row decoder/word line driver 608 may also select/deselect and drive SSG line 415 and DSG line 413. The row decoder/word line driver 608, described in detail below, is configured to perform an erase operation on the memory cell 406 coupled to the selected word line (s) 418. The voltage generator 610 may be configured to be controlled by the control logic unit 612, and to generate word line voltages (e.g., read voltage, program voltage, pass voltage, local voltage, verification voltage, etc.), bit line voltages and source line voltages to be supplied to the memory array 401.

The control logic unit 612 may be coupled to each peripheral circuits described above and configured to control the operation of each peripheral circuits. The register 614 may be coupled to the control logic unit 612, and includes a status register, a command register and an address register for storing a status information, a command opcode (OP code) and a command address for controlling the operation of each peripheral circuit. The interface 616 may couple to the control logic unit 612 and act as a control buffer to buffer and relay control commands received from a host (not shown) to the control logic unit 612 and buffer and relay status information received from the control logic unit 612 to the host. The Interface 616 may also couple to the column decoder/bit line driver 606 via the data bus 618 and act as a data I/O interface and a data buffer to buffer and relay data to or from the memory array 401.

Based on the memory system and memory described above, the charge stored in the memory cell will change with the increase of time, repeated read operations, etc., thus affecting the accuracy of data read. Usually, the offset voltage in the preset read voltage offset table can be added to the initial voltage value, and a set of offset voltages that can read data correctly can be found through repeated attempts. After the data in the memory block of the memory is stored for a long time, the memory cells in each memory page have different threshold voltage shifts. Then, when reading a large amount of data, it is necessary to repeatedly poll the preset read voltage offset table, and then superimpose operations such as hardware decoding and software decoding, which takes a long time. Such a reading process obviously affects the performance of the memory, especially for enterprise-level applications, causing the quality of service (QoS) to fail to meet the standard.

Figure 7:
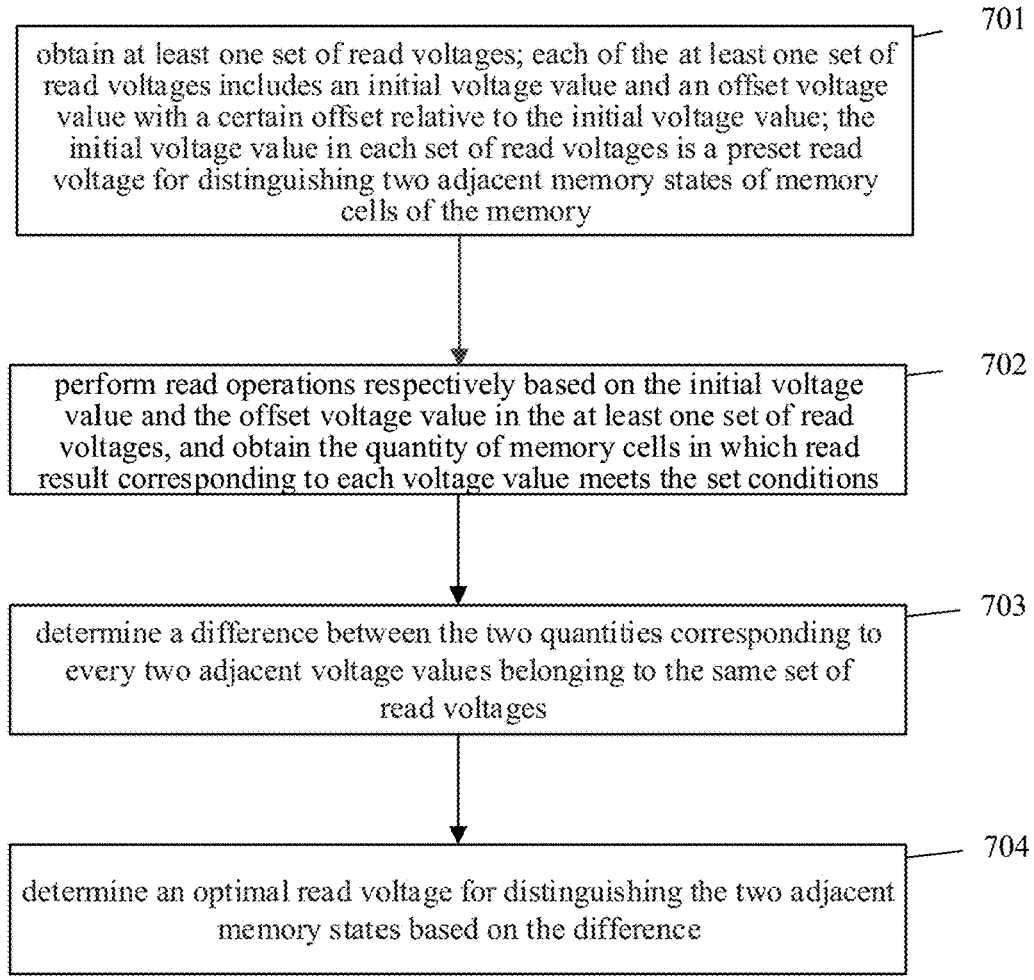
FIG. 7 shows a flow diagram of the method for operating the memory according to the embodiments of the present disclosure.

In order to solve the above technical problem, an operating method for a memory is provided by the embodiment of the present disclosure, as shown in FIG. 7 for details, the method may include steps S701 to S704.

At step S701, at least one set of read voltages are obtained. Each of the at least one set of read voltages can include an initial voltage value and an offset voltage value with a certain offset relative to the initial voltage value. The initial voltage value in each set of read voltages can be a preset read voltage for distinguishing two adjacent memory states of the memory cells of the memory.

It should be noted that the method for operating the memory provided by the embodiment of the present disclosure is a method for determining the optimal read voltage. Here the memory cell of the memory may be of the type SLC. MLC, TLC, QLC or the like. The two adjacent memory states may refer to any two adjacent memory states of any type of memory cell. That is, the operating method provided by the embodiment of the present disclosure is suitable for determining an optimal read voltage for any two adjacent memory states.

Figure 8:
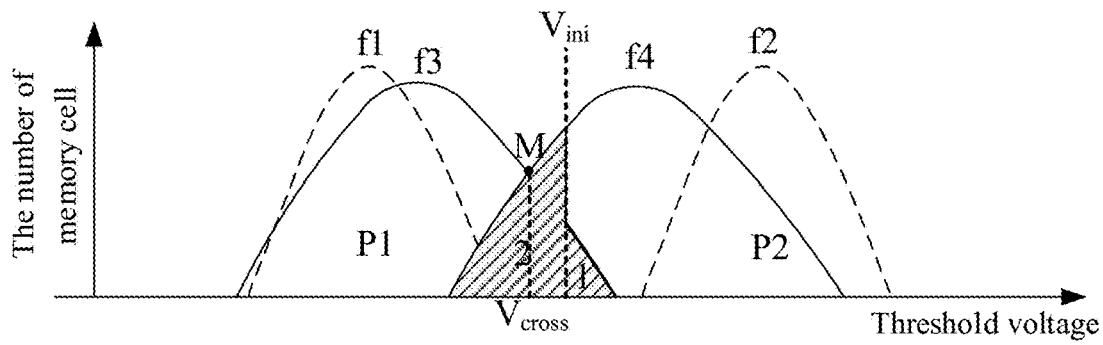
FIG. 8 shows a schematic diagram of distribution of threshold voltage of any two adjacent memory states of a memory cell according to the embodiments of the present disclosure.

For how to distinguish the two adjacent memory states of a memory cell, see a schematic diagram showing a threshold voltage distribution corresponding to any two adjacent memory states of a memory cell as shown in FIG. 8. The regions f1 and f2 surrounded by dashed lines in FIG. 8 indicate the threshold voltage distribution before the charge number of the memory cells in the memory states P1 and P2 is changed, respectively. At this time, the initial voltage value $V_{ini}$ is applied to the memory cell when the data of the memory is read. It is obvious that the initial voltage value $V_{ini}$ is greater than the threshold voltage of the memory cell corresponding to f1 and less than the threshold voltage of the memory cell corresponding to f2. Therefore, when the initial voltage value $V_{ini}$ is used to read the memory cell in the memory state P1 or the memory state P2 before the charge number of the memory cell changes, it is easy to distinguish whether the memory cell is in the memory state P1 or the memory state P2 so as to obtain the data stored in the memory cell. However, during the use of the memory, with the increase of the use time, the read interference, the programming erasure times, the data retention ability and the crossover temperature of the memory will change, and the threshold voltage of each of memory cells will also change. The regions f3 and f4 in FIG. 8 indicate the threshold voltage distribution after the charge number of the memory cells in the memory states P1 and P2 is changed, respectively. In FIG. 8, f3 and f4 appear offset and broadening with respect to the morphology of f1 and f2, respectively. An overlapping region is between the two memory states near the initial voltage value $V_{ini}$. At this time, when the initial voltage value $V_{ini}$ is used to read the data on each of memory cells, the memory state P2 in the region 2 may be wrongly judged as the memory state P1, and the memory state P1 in the region 1 may be wrongly judged as the memory state P2. When the threshold voltage is equal to the initial voltage value $V_{ini}$ it is also impossible to correctly judge whether the memory cell is in the memory state P1 or the memory state P2, which increases the probability of reading errors.

The threshold voltage offset of the memory cell is inevitable with the increase of the storage time and the increase of the number of reads. In order to obtain the correct reading data, the memory is provided with an error correction function using an ECC (Error Correcting Code). It should be known that the fewer bits of statistical errors, the fewer bits that need to be corrected by ECC, so the greater the probability of correct reading, the less the reading time required, and the corresponding read voltage is optimal at this time. From the threshold voltage distribution of two adjacent memory states shown in FIG. 8, when the read voltage $V_{cross}$ is at the intersection point M of the two memory states corresponding to F3 and F4, the number of bits of statistical error is the least, and the read voltage $V_{cross}$ is the optimal read voltage. The intersection point M may also be called the valley bottom position where the threshold voltage ranges corresponding to two adjacent memory states overlap. That is, the operating method provided by the embodiment of the present disclosure is to determine the valley bottom position or the direction of the valley bottom position to determine the optimal read voltage.

Each set of read voltages includes an initial voltage value that may refer to a preset read voltage for distinguishing two adjacent memory states of a memory cell of the memory. The preset read voltage may be an empirical value or be the default value configured when the memory leaves the factory, which is obtained after a large number of simulation experiments before the memory leaves the factory. Each initial voltage value can distinguish two adjacent memory states in the previous reading process.

In some embodiments, at least one set of read voltages may be obtained by:

determining at least one of the initial voltage values;

sequentially increasing or decreasing the first initial voltage value of the at least one initial voltage value with equal offsets to obtain a first offset voltage value with a certain offset relative to the first initial voltage value;

obtaining a corresponding set of read voltages based on the first initial voltage value and the first offset voltage value; and obtaining at least one set of read voltages based on each set of the corresponding set of read voltages.

It should be noted that there may be multiple initial voltage values with certain voltage differences between two adjacent memory states in actual use. Based on the foregoing description, the initial voltage value may be either an empirical value or a factory default value. Thus, the determination of at least one initial voltage value here means obtaining a plurality of previous empirical values or a plurality of factory test default values.

After obtaining at least one initial voltage value, each initial voltage value of the at least one initial voltage value is offset to obtain an offset voltage value having a certain offset relative to each initial voltage value, so that each initial voltage value and its corresponding offset voltage value form a set of read voltages and finally obtain at least one set of read voltages. Since the acquisition mode for each set of read voltages is similar, only the first initial voltage value will be explained as an example. The first initial voltage value is any one of the at least one initial voltage value.

Specifically, sequentially increasing or decreasing the first initial voltage value with equal offsets to obtain a first offset voltage value with a certain offset relative to the first initial voltage value; and the first initial voltage value and the first offset voltage value are then formed into a set of read voltages relative to the first initial voltage value.

Figure 9:
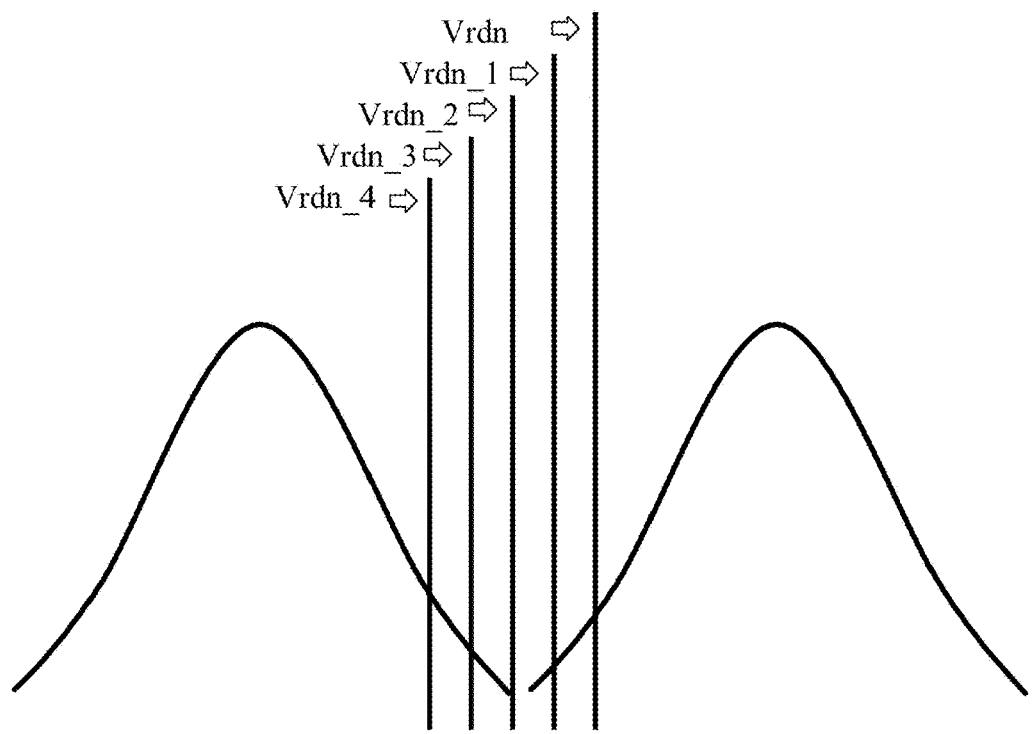
FIG. 9 shows a schematic diagram of a relationship between a first set of read voltages according to the embodiments of the present disclosure.

An example is shown in FIG. 9, it is assumed that the first initial voltage value Vrdn has an offset with respect to the first initial voltage value. The offset voltage values are, in turn, Vrdn_1. Vrdn_2, Vrdn_3, Vrdn_4, where these offset voltage values decrease in turn by an equal offset on one side (left side) of the initial voltage value Vrdn. It should be understood that this is only an example and can be incremented sequentially by an equal offset to the right of the initial voltage value.

It should also be noted that for different initial voltage values of the at least one initial voltage value, the offset amount for obtaining the corresponding offset voltage value may be equal or not equal.

For example, it is assumed that the at least one initial voltage value comprises a first initial voltage value and a second initial voltage value. The first initial voltage value obtains an equal offset of the offset voltage value of U millivolts (mV), and the second initial voltage value obtains an equal offset of the offset voltage of U mV or any possible value different from U mV.

At step S702, read operations are performed respectively based on the initial voltage values and the offset voltage values in the at least one set of read voltages, and the quantity of memory cells in which read result corresponding to each voltage value meets the set conditions is obtained.

In some embodiments, performing read operations respectively based on the initial voltage value and the offset voltage value in the at least one set of read voltages, and obtaining the quantity of memory cells in which read result corresponding to each voltage value meets the set conditions may include:

reading a memory plane in the memory using the initial voltage value and the offset voltage value contained in each of the at least one set of read voltages, respectively;

counting the quantity of memory cells in which read results meet the set conditions contained in the memory plane read by each voltage value.

It should be noted that the memory may include a plurality of planes. In practical application, before the memory cells are programmed to store data, the data to be stored is scrambled so as to reduce the occurrence of successive digits 0 or 1 and ensure that the probability of occurrence of digits 0 or 1 is close to 50%. This results in the fact that the quantity of memory cells in the memory state contained in each memory plane is basically equal for the same memory state. Therefore, one memory plane of the memory can be read separately by using the voltage value of a set of read voltages to count the quantity of memory cells in the memory state in each memory plane.

Here, the read result meeting the set conditions may mean that the read result is a set number meeting the set conditions, wherein the set number may be 1 or 0. In an alternative, the read result of a memory cell having a threshold voltage less than the read voltage is a set number (the set number is 1), and the read result of a memory cell having a threshold voltage greater than the read voltage is 0. In another alternative, the read result of a memory cell having a threshold voltage greater than the read voltage is a set number (the set number is 0), and the read result of a memory cell having a threshold voltage less than the read voltage is 1.

The reading process described here can include reading a memory plane in the memory respectively using the initial voltage value and offset voltage value contained in each of the at least one set of read voltages, and counting the quantity (or the number) of memory cells in which read results meet the set conditions included in the memory plane. That is, each voltage value in each of the at least one set of read voltages is respectively applied to a memory plane in the memory to perform a read operation, and then, how many memory cells in which read result is the set number contained in each memory plane is counted.

Figure 10:
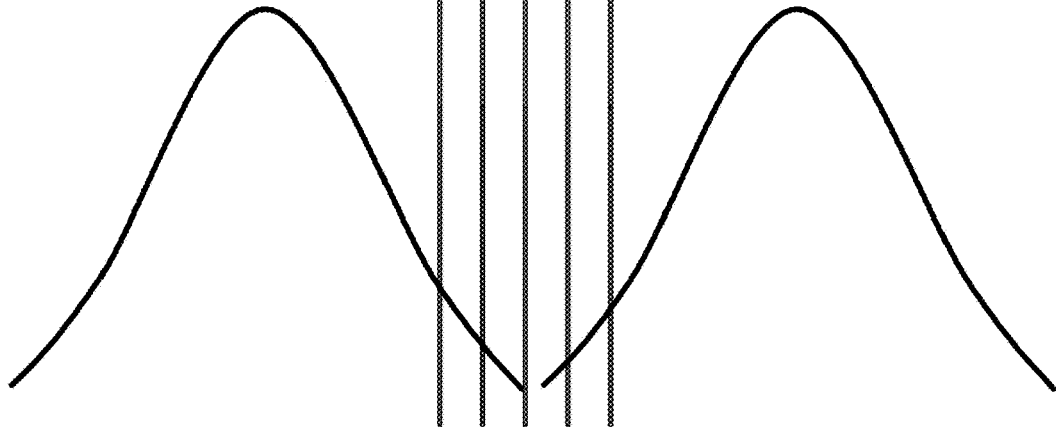
FIG. 10 is a schematic diagram showing the quantity of memory cells in which reading results contained in each memory plane when one memory plane is present respectively read employing a plurality of voltage values shown in FIG. 9 satisfy the set conditions, according to the embodiments of the present disclosure.

For example, as shown in FIG. 10, when the at least one set of read voltages includes a set of read voltages, if the set of read voltages includes: Vrdn, Vrdn_1, Vrdn_2, Vrdn_3, Vrdn_4, and the set number is 1, the above reading process is to read one of the memory planes in memory respectively using Vrdn, Vrdn_1, Vrdn_2, Vrdn_3 and Vrdn_4, such as reading the memory planes Plane0, Plane1, Plane2, Plane3, Plane4 of the memory respectively. Then, counting the number of memory cells with a read result of 1 in each memory plane. For example, the number of memory cells with a read result of 1 contained in Plane0 is: C1_Vrdn, the number of memory cells with a read result of 1 contained in Plane1 is: C2_Vrdn, the number of memory cells with a read result of 1 contained in Plane2 is: C3_Vrdn, the number of memory cells with a read result of 1 contained in Plane3 is: C4_Vrdn, and the number of memory cells with a read result of 1 contained in Plane4 is: C5_Vrdn.

At step S703, a difference between the two quantities corresponding to every two adjacent voltage values belonging to the same set of read voltages is determined.

Here, every two adjacent voltage values belonging to the same set of read voltages may refer to: every two adjacent voltage values in a certain initial voltage value and its corresponding offset voltage. For example, the every two adjacent voltage values of the initial voltage value Vrdn and its corresponding offset voltage values Vrdn_1, Vrdn_2, Vrdn_3, Vrdn_4 are: (Vrdn, Vrdn_1); (Vrdn_1, Vrdn_2); (Vrdn_2, Vrdn_3); (Vrdn_3, Vrdn_4). Based on the quantity of the memory cells in which read result is the set number in the memory plane corresponding to each voltage value in the set of read voltages, the difference between the quantities corresponding to every two adjacent voltage values can be obtained as:

e1_Vrdn=C1_Vrdn-C2 Vrdn;
e2_Vrdn=C2_Vrdn-C3_Vrdn;
e3_Vrdn=C3_Vrdn-C4_Vrdn;
e4 Vrdn=C4 Vrdn-C5 Vrdn.

Figure 11:
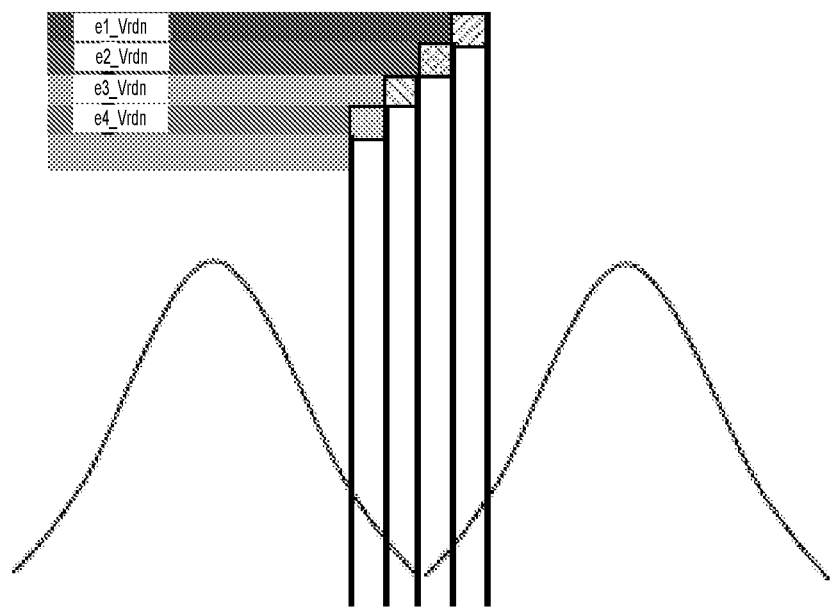
FIG. 11 shows a schematic diagram of a difference corresponding to every two adjacent voltage values shown in FIG. 10 according to the embodiments of the present disclosure.

In an embodiment, the difference between the two quantities corresponding to every two adjacent voltage values belonging to the same set of read voltages can be intuitively referred to the schematic diagram of each of the difference shown in FIG. 11.

At step S704, an optimal read voltage for distinguishing the two adjacent memory states based on the difference is determined.

In some embodiments, the at least one set of read voltages includes a first set of read voltages, and determining an optimal read voltage for distinguishing between the two adjacent memory states based on the difference may include:

determining an offset direction of the optimal read voltage with respect to an initial voltage value in the first set of read voltages when the change trend of the difference is consistent with the change trend of a voltage value in the first set of read voltages; and determining the optimal read voltage based on the offset direction and a preset read voltage offset table.

It should be noted that it is described here that the at least one set of read voltages only includes the first set of read voltages, that is, only includes one initial voltage value and an offset voltage value relative to the initial voltage value. In this case, determining the optimal read voltage based on the difference can be further divided into two situations: how to determine the optimal read voltage when the change trend of the difference is consistent with the change trend of a voltage value in the first set of read voltages; and how to determine the optimal read voltage when the change trend of the difference is inconsistent with the change trend of a voltage value in the first set of read voltages.

For the former case, when the change trend of the difference is consistent with the change trend of a voltage value in the first set of read voltages, the offset direction of the optimal read voltage relative to the first set of read voltages is determined firstly. Then, the optimal read voltage is determined according to the offset direction and the preset read voltage offset table. The preset read voltage offset table may include multiple sets of preset voltage offsets obtained through a lot of experiences or experiments. When in use, each preset voltage offset in the preset read voltage offset table is loaded to the default initial read voltage (for example, $V_{ini}$; or Vrdn, or its value) to get the read voltage read. The optimal set of read voltages are obtained through repeated attempts until a set of preset offset voltages that can read data correctly is found. Thereby the probability of reading data correctly is increased. The specific preset read voltage offset table is shown in Table 1.

It should be noted that Rd1 to Rd7 in Table 1 represent different initial read voltages. Since different types of memory cells contain different numbers of memory states, the default voltage for every two adjacent memory states in these memory states is different. That is, the preset read voltage offset table includes a set of preset voltage offsets corresponding to the default initial read voltages of every two adjacent memory states. Each set of preset offset voltages includes a positive offset that increases in a direction greater than the default initial read voltage and a negative offset that decreases in a direction that is smaller than the default initial read voltage. For example, for the default initial read voltage Rd7, +V1, +V2, +V3, +V4 are positive offsets, where the values of V1, V2, V3, and V4 increase sequentially; −V5 to −V11 is a negative offset, wherein the values from V5 to V11 decrease sequentially.

TABLE 1

Preset Read Voltage Offset Table 1

| Rd1 | Rd2 | Rd3 | Rd4 | Rd5 | Rd6 | Rd7 |
|---|---|---|---|---|---|---|
| — | — | — | — | — | — | 0 |
| — | — | — | — | — | — | +V1 |
| — | — | — | — | — | — | +V2 |
| — | — | — | — | — | — | +V3 |
| — | — | — | — | — | — | +V4 |
| — | — | — | — | — | — | −V5 |
| — | — | — | — | — | — | −V6 |
| — | — | — | — | — | — | −V7 |
| — | — | — | — | — | — | −V8 |
| — | — | — | — | — | — | −V9 |
| — | — | — | — | — | — | −V10 |
| — | — | — | — | — | — | −V11 |

In some embodiments, an offset direction of the optimal read voltage with respect to an initial voltage value in the first set of read voltages can be determined by:

determining that the offset direction of the optimal read voltage with respect to the initial voltage value in the first set of read voltages is leftward when a change trend of the voltage value in the first set of read voltages is sequentially decreased with respect to the initial voltage value in the first set of read voltages; and determining the offset direction of the optimal read voltage with respect to the initial voltage value in the first set of read voltages is rightward when a change trend of the voltage value in the first set of read voltages is sequentially increased with respect to the initial voltage value in the first set of read voltages.

In an embodiment, when the bias voltage value of the first set of read voltages is on the left side of the initial voltage value of the first set of read voltages and the change trend decreases sequentially with respect to the initial voltage value of the first set of read voltages, the offset direction of the optimal read voltage with respect to the initial voltage value of the first set of read voltages is determined to be left shift. That is, the optimal read voltage is on the left side of the first initial voltage value. When the offset voltage value of the first set of read voltages is on the right side of the initial voltage value of the first set of read voltages and the change trend is sequentially increasing with respect to the initial voltage value of the first set of read voltages, the offset direction of the optimal read voltage with respect to the initial voltage value of the first set of read voltages is determined to be rightward. That is, the optimal read voltage is on the right side of the initial voltage value of the first set of read voltages.

After an offset direction of the optimal read voltage is obtained, in some embodiments, the optimal read voltage based on the offset direction and a preset read voltage offset table may can be determined by:

selecting a first optimal offset from the preset read voltage offset table based on the offset direction; and determining the optimal read voltage based on the first optimal offset and the initial voltage value in the first set of read voltages.

It should be noted that after the offset direction of the optimal read voltage is determined, a first optimal offset can be selected from the preset read voltage offset table; the optimal read voltage is then determined based on the first optimal offset and an initial voltage value in the first set of read voltages. Here, the first optimal offset may include at least one preset offset voltage. When the first optimal offset includes a plurality of preset offset voltage, determining the optimal read voltage based on the first optimal offset and an initial voltage value in the first set of read voltages may mean loading each preset offset voltage included in the first optimal offset to a corresponding default initial read voltage, performing a plurality of experiments to find a preset offset voltage capable of correctly reading the stored data of the memory cell, so as to obtain an optimal read voltage. In this way, after determining the offset direction of the optimal read voltage, a set of first optimal offsets closer to the optimal read voltage can be found in a preset read voltage offset table. The corresponding default initial read voltage is subsequently loaded with one or more preset offset voltage of the first optimal offset amounts to obtain a plurality of read voltages, thereby reducing the range of repeated attempts to obtain the preset offset voltage amounts required to correctly read data and reducing the reread ratio.

For example, see Table 2, if the initial voltage value Vrdn1 included in the first set of read voltages is −V5, the offset direction of the optimal read voltage with respect to the initial voltage value −V5 is shifted to the left, that is, shifted to a direction less than the initial voltage value. Based on this, combined with the preset read voltage offset table shown in Table 1, a preset offset voltages including −V5 to −V11 are obtained from the first optimal offset. These preset offset voltages are then applied to the default initial read voltage Rd7 to attempt to obtain the optimal read voltage. In such a way, without the need of attempting the forward +V1 to +V4, the range of repeated attempts to obtain the preset offset voltages required to correctly read data is narrowed, and the reread ratio is reduced.

TABLE 2

Preset Read Voltage Offset Table 2

| Rd1 | Rd2 | Rd3 | Rd4 | Rd5 | Rd6 | Rd7 |
|---|---|---|---|---|---|---|
| — | — | — | — | — | — | 0 |
| — | — | — | — | — | — | +V1 |
| — | — | — | — | — | — | +V2 |
| — | — | — | — | — | — | +V3 |
| — | — | — | — | — | — | +V4 |
| — | — | — | — | — | — | −V5 |
| — | — | — | — | — | — | −V6 |
| — | — | — | — | — | — | −V7 |
| — | — | — | — | — | — | −V8 |
| — | — | — | — | — | — | −V9 |
| — | — | — | — | — | — | −V10 |
| — | — | — | — | — | — | −V11 |

For the latter case, in some embodiments, the method may also include:

determining a minimum one of the difference when a change trend of the difference is inconsistent with a change trend of voltage values in the first set of read voltages; and determining the optimal read voltage based on the minimum difference.

It should be noted that, according to the characteristics of the threshold voltage distribution of the memory cells of the memory, when the change trend of the difference is inconsistent with the change trend of the voltage value in the first set of read voltages, that is, the change trend of the difference is not monotonously changed, but contains an inflection point (the minimum difference) therein, which means that the quantity of the memory cells in which read result corresponding to each voltage meets the set conditions is not monotonous, i.e, a intersection is between the two adjacent memory states, when the memory cells in one of two adjacent memory states are read with the voltage value in the first set read voltages. According to the aforementioned FIG. 9, at the intersection M in the threshold voltage distributions corresponding to two adjacent memory states, the corresponding read voltage $V_{cross}$ is the optimal read voltage. Therefore, the range between two adjacent voltage values in the first set of read voltages corresponding to the inflection point of the difference includes the read voltage $V_{cross}$ corresponding to the intersection point M, that is, the optimal read voltage.

Figure 12:
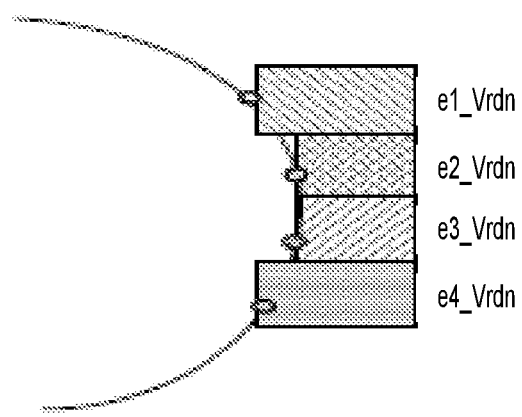
FIG. 12 shows a schematic diagram of the difference with inflection points according to the embodiments of the present disclosure.

For example, a schematic diagram of the difference is shown in FIG. 11. When e2_Vrdn<e3_Vrdn<e1_Vrdn/e4_Vrdn (as shown in FIG. 12), the e2_Vrdn may be determined as the minimum one of the difference. The optimal read voltage is contained between the two adjacent voltage values corresponding to the minimum difference.

In some embodiments, determining the optimal read voltage based on the minimum difference may comprise:

determining two adjacent voltage values corresponding to the minimum difference from offset voltage values in the first set of read voltages, and determining an average voltage value of the two adjacent voltage values as the optimal read voltage.

It should be noted that the optimal read voltage is the average voltage value of two adjacent voltage values corresponding to the minimum difference.

In the actual application process, one or more preset offset voltages between the two adjacent voltage values are determined from a preset read voltage offset table after two adjacent voltage values corresponding to the minimum difference are obtained. Then, an optimal read voltage is obtained from one or more preset offset voltage between the two adjacent voltage values in the manner described above for obtaining an optimal read voltage from a preset offset voltage included in the first optimal offset.

The previously described scheme is a way of determining an optimal read voltage in which the at least one set of read voltages contains only a first set of read voltages. In some embodiments, the at least one set of read voltages further comprises a second set of read voltages, wherein a certain voltage difference is between an initial voltage value in the second set of read voltages and an initial voltage value in the first set of read voltages; an offset voltage value in the second set of read voltages and an offset voltage value in the first set of read voltages are located between an initial voltage value in the second set of read voltages and an initial voltage value in the first set of read voltages; the difference comprises a first sub-difference corresponding to a first set of read voltages and a second sub-difference corresponding to a second set of read voltages:

determining an optimal read voltage for distinguishing the two adjacent memory states based on the difference includes:

determining the optimal read voltage based on a first change trend of the first sub-difference and/or a second change trend of the second sub-difference;

wherein an initial voltage value in the second set of read voltages is greater than or less than an initial voltage value in the first set of read voltages.

Figure 13:
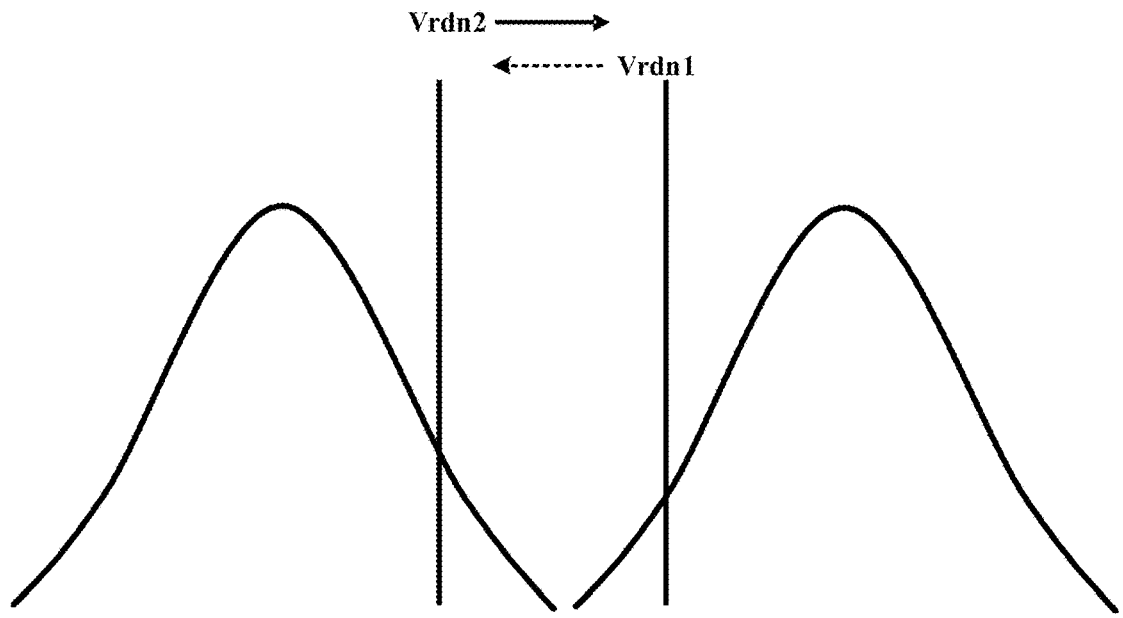
FIG. 13 shows a schematic diagram of relationship in which the initial voltage value Vrdn1 included in a first set of read voltages is greater than the initial voltage value Vrdn2 included in a second set of read voltages when the at least one set of read voltages includes the first set of read voltages and the second set of read voltages, according to the embodiments of the present disclosure.

It should be noted that, in the solution described here, at least one set of read voltages includes a first set of read voltages and a second set of read voltages. A certain voltage difference is between the initial voltage values included in the first set of read voltages and the initial voltage values included in the second set of read voltages; the initial voltage value included in the first group of read voltages is greater than or smaller than the initial voltage value included in the second group of read voltages. The offset voltage value included in the first set of read voltages and the offset voltage value included in the second set of read voltages are between the initial voltage value in the first set of read voltages and the initial voltage value in the second set of read voltages. It should be noted that only when the offset voltage value is between the two initial voltage values, the optimal read voltage can be determined by using the aforementioned two sets of readings. For details, refer to FIG. 13. The aforementioned difference includes a first sub-difference corresponding to the first set of read voltages and a second sub-difference corresponding to the second set of read voltages. In this case, the determining of the optimal read voltage may include: determining based on the first change trend of the first sub-difference and/or the second change trend of the second sub-difference. It should be noted, the way to the optimal read voltage is the same, whether the initial voltage value included in the first set of read voltages is greater or smaller than the initial voltage value included in the second set of read voltages.

Therefore, in some embodiments, determining the optimal read voltage based on a first change trend of the first sub-difference and/or a second change trend of the second sub-difference when an initial voltage value in the first set of read voltages is greater than an initial voltage value in the second set of read voltages comprises;

determining the optimal read voltage based on a minimum one of the first sub-difference when the first change trend is inconsistent with a change trend of a voltage value in the first set of read voltages and the second change trend is consistent with a change trend of a voltage value in the second set of read voltages.

It should be noted that, in this case, an inflection point is included between the first sub-differences, and an optimal read voltage is included among voltage values in the first group of read voltages corresponding to the inflection point. The way to obtain the optimal read voltage has been described clearly in the above, and will not be repeated here.

In some embodiments, the operating method further comprises:

determining an optimal read voltage based on a minimum one of the first sub-difference and/or a minimum one of the second sub-difference when the first change trend is inconsistent with a change trend of voltage values in the first set of read voltages and the second change trend is inconsistent with a change trend of voltage values in the second set of read voltages.

It should be noted that, in this case, if the inflection points corresponding to the first sub-difference and the second sub-difference are the same one, the optimal read voltage is determined based on two adjacent voltage values in a first set of read voltages corresponding to a minimum one of the first sub-difference, or the optimal read voltage is determined based on two adjacent voltage values in a second set of read voltages corresponding to a minimum one of the second sub-difference. The way to obtain the optimal read voltage ing has been described clearly in the case where only the first set of read voltages is included, and will not be repeated here. If the inflection points corresponding to the first sub-difference and the second sub-difference are different, the optimal read voltage is determined based on two adjacent voltage values in a first set of read voltages corresponding to a minimum one of the first sub-difference and two adjacent voltage values in a second set of read voltages corresponding to a minimum one of the second sub-difference.

In an embodiment, it is assumed that two adjacent voltage values in the first set of read voltages corresponding to the smallest one of the first sub-difference are respectively: a first voltage value and a second voltage value; and the two adjacent voltage values in the second set of read voltages corresponding to the minimum one of the second sub-difference are respectively; a third voltage value and a fourth voltage value. The optimal read voltage is determined based on the first voltage value, the second voltage value, the third voltage value and the fourth voltage value in the following ways:

First, the average voltage value of the first voltage value, the second voltage value, the third voltage value and the fourth voltage value is taken as the optimal read voltage.

Second, one or more preset offset voltages included in a voltage value range consisting of the first voltage value, the second voltage value, the third voltage value, and the fourth voltage value are obtained based on a preset read voltage offset table, and then an optimal read voltage is obtained according to the aforementioned attempts.

Third, a first average voltage value between the first voltage value and the second voltage value is obtained; and a second average voltage value between the third voltage value and the fourth voltage value is obtained. Then, an optimal read voltage is obtained according to the aforementioned attempts based on one or more preset offset voltages included in the voltage value range consisting of the first average voltage value and the second average voltage value obtained based on the preset read voltage offset table.

It should be noted that the aforementioned three ways to determine the optimal read voltage based on the first voltage value, the second voltage value, the third voltage value and the fourth voltage value are only three examples. Other possible implementations are included in the practical application process. The specific implementation process is not depart from the technical scheme described in this application, and will not be repeated here.

In other embodiments, the operating method can further include:

determining the optimal read voltage based on a minimum one of the second sub-difference when the first change trend is consistent with a change trend of voltage values in the first set of read voltages and the second change trend is inconsistent with a change trend of voltage values in the second set of read voltages.

It should be noted that in this case, the second sub-difference contain an inflection point, and the voltage values in the second set of read voltages corresponding to the inflection point contain an optimal read voltage. The way to obtain the optimal read voltage has been described clearly in the above, and will not be repeated here.

In still other embodiments, the operating method can further include:

when the first change trend is consistent with a change trend of a voltage value in the first set of read voltages and the second change trend is consistent with a change trend of a voltage value in the second set of read voltages, determining a first offset direction of the optimal read voltage with respect to an initial voltage value in the first set of read voltages, and determining a second offset direction of the optimal read voltage with respect to an initial voltage value in the second set of read voltages;

determining a second optimal offset from the preset read voltage offset table based on the first offset direction and the second offset direction; and determining the optimal read voltage based on an initial voltage value in the first set of read voltages, an initial voltage value in the second set of read voltages, and the second optimal offset.

It should be noted that, as defined above, the initial voltage value in the first set of read voltages is greater than the initial voltage value in the second set of read voltages. Thus, determining that an offset direction of the optimal read voltage with respect to the initial voltage value in the first set of read voltages is leftward, that is, the first offset direction, the offset direction of the optimal read voltage with respect to the initial voltage value in the first set of read voltages, is leftward. Determining that an offset direction of the optimal read voltage with respect to the initial voltage value in the second set of read voltages is rightward, that is, the second offset direction, the offset direction of the optimal read voltage with respect to the initial voltage value in the second set of read voltages, is rightward. One or more preset offset voltages included in the second optimal offset are obtained from the preset read voltage offset table based on the first offset direction and the second offset direction. The optimal read voltage is obtained based on the preset offset voltages in the attempted manner described above, the specific manner of which will not be repeated here.

Figure 16:
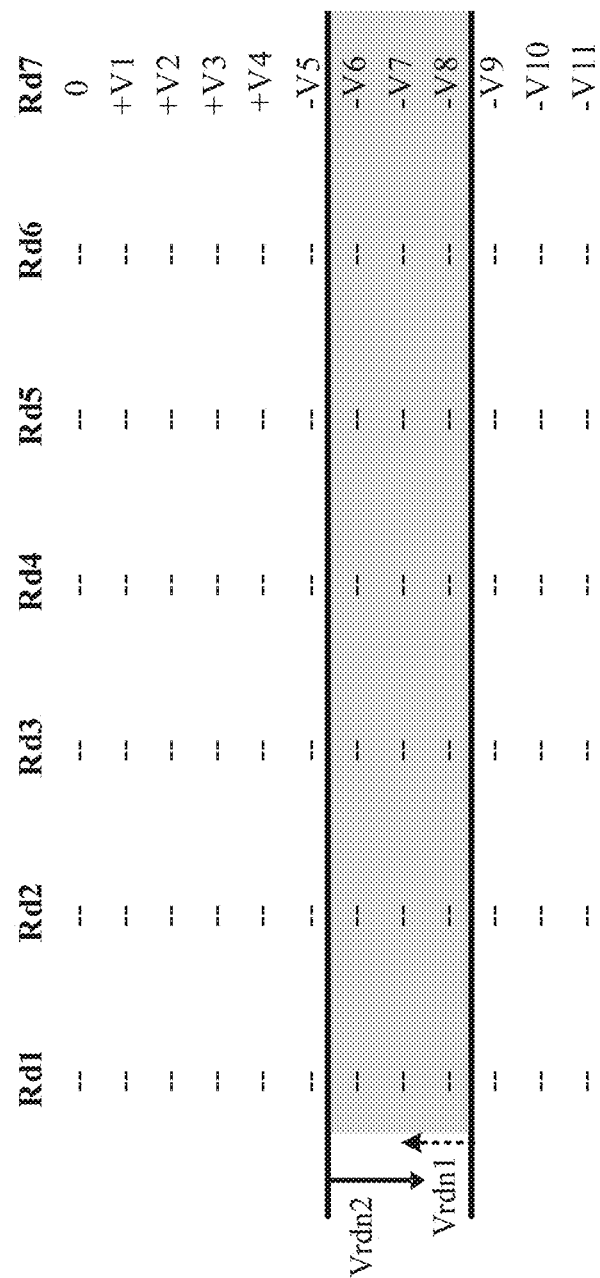
FIG. 16 shows a preset read voltage offset table.

See FIG. 16. For example, if the initial voltage value Vrdn1 of the first set of read voltages is −V8 and the initial voltage value Vrdn2 of the second set of read voltages is −V6, Vrdn1 is larger than Vrdn2 because the values of V5 to V11 decrease in turn, the offset of −V5 to −V11 become smaller in the negative direction. At this time, one or more preset offset voltage quantities contained in the second optimal offset includes −V6 to −V8, then an optimal read voltage is obtained based on these preset offset voltage quantities. How to determine the optimal read voltage based on the preset offset voltage has been described above and is not repeated here.

In some embodiments, the operating method may be used when the memory is idle or during operation of a user.

It should be noted that the operating method provided by the embodiment of the present disclosure can be used when the memory is idle or during operation of a user. The "idle" may mean the time period during which the memory is not operated by various operations such as reading or programming. During this time period, all the steps of the operating method provided by the embodiment of the present disclosure can be run at one time to obtain the optimal read voltage set. The period for the operation of user may refer to when a user reads or writes or otherwise operate to a memory. During this time, all steps of the operating method provided by the embodiment of the present disclosure may be executed step by step during the user operation to finally obtain an optimal read voltage set.

In some embodiments, the memory includes registers for storing the optimal read voltage.

Figure 14:
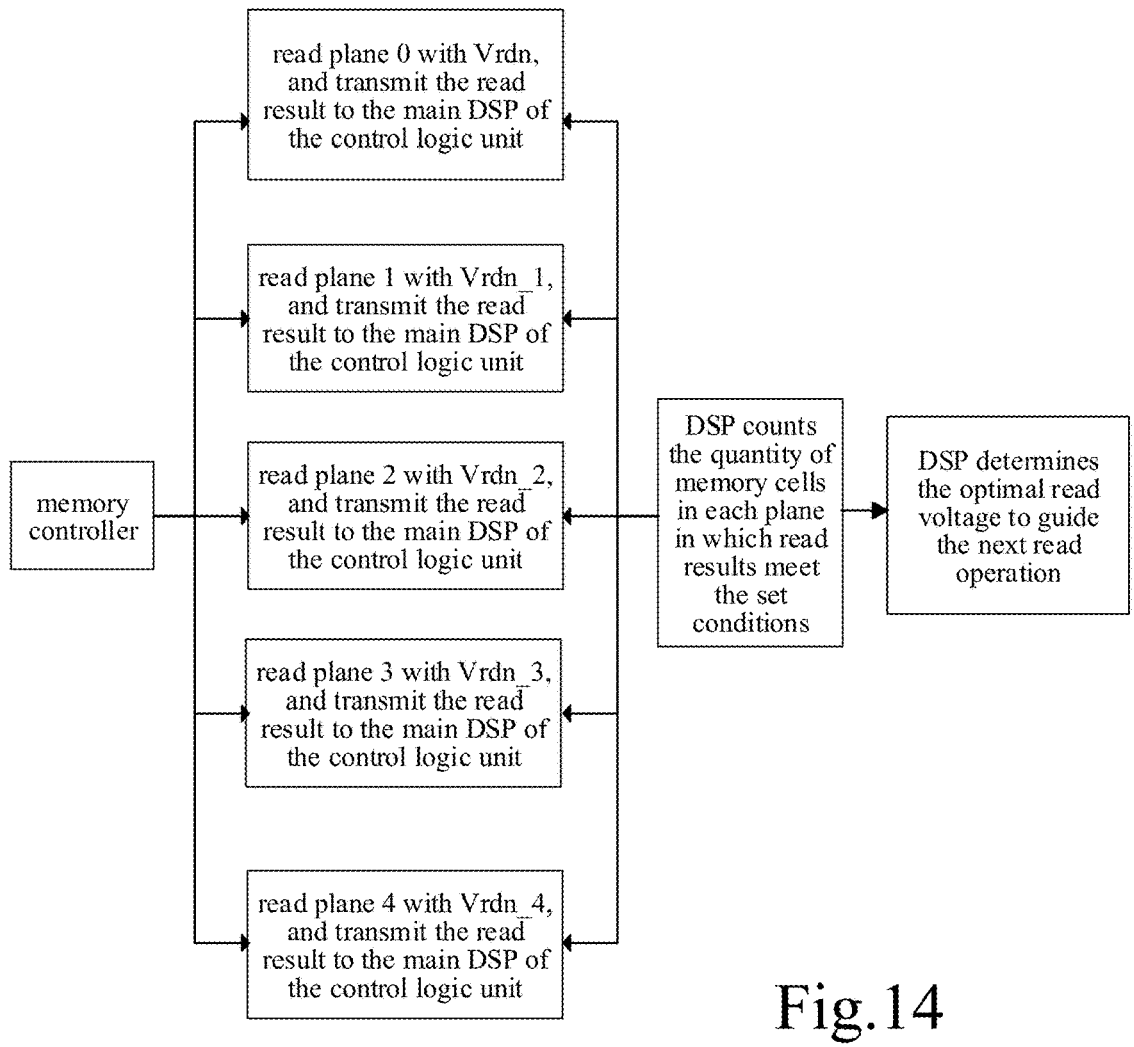
FIG. 14 shows a flow diagram for realizing the operating method according to the embodiments of the present disclosure.

For the operating method provided by the embodiment of the application described above, in the actual implementation process, there are two ways, In an optional implementation, as shown in FIG. 14, there are multiple different memory planes in a DIE. Generally speaking, the number of planes contained in a DIE is even. For two adjacent memory states, multiple offset voltage values are set based on the initial voltage value Vrdn as Vrdn_1, Vrdn_2, Vrdn_3, Vrdn_4 to form a set of read voltages. Each voltage value in this set of read voltages is used to read live planes in a DIE simultaneously. That is, the memory controller causes the control logic unit contained in the memory to send read command containing different read voltages to five planes (for example, Plane0, Plane1, Plane2, Plane3, Plane4) at the same time, reading Plane0 with Vrdn, reading Plane1 with Vrdn_1, reading Plane2 with Vrdn_2, reading Plane3 with Vrdn_3, reading Plane4 with Vrdn_4. Then the reading results of each of memory cells in each of planes are received using the main digital signal processing (DSP) of the memory controller, and the quantity of memory cells whose reading results in each plane meet the set conditions is counted. After that, DSP determines the optimal read voltage based on these quantities to guide the next read operation.

Figure 15:
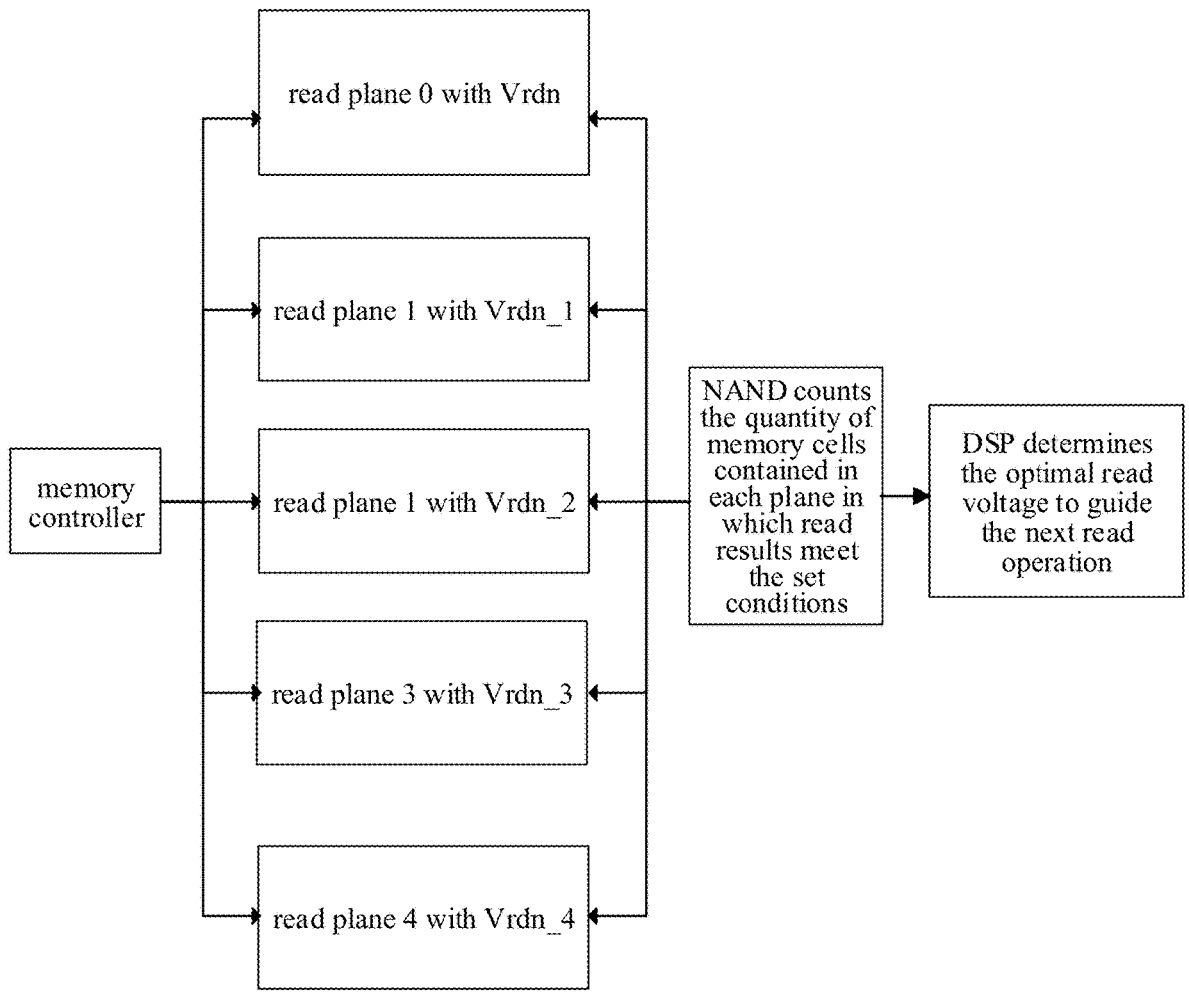
FIG. 15 shows another flow diagram for realizing the operating method according to the embodiments of the present disclosure.

Another optional implementation is shown in FIG. 15. When the memory array of the memory is a NAND flash memory, if the NAND flash memory has a statistical function, the only difference between FIG. 15 and FIG. 14 is that the step of counting the quantity of memory cells marked as the set value is performed by the NAND using its own control logic unit in the peripheral circuit, to counts the quantity of memory cells in each plane whose reading results meet the set conditions, and sends the counted quantity to the DSP included in the memory controller. The rest of the steps are the same as those shown in FIG. 14, which have been described in detail above and will not be repeated here.

The method for operating the memory provided by the embodiment of the present disclosure is to set at least one set of read voltages including a plurality of voltage values, and use each voltage value to respectively perform a read operation on the memory cell of the memory, and obtain the quantity that read result satisfies the set conditions; then, according to the difference between the quantities corresponding to every two adjacent voltage values belonging to the same set of read voltages, determine the optimal read voltages of two adjacent memory states corresponding to the set of read voltages memory cell used to distinguish the memory cell of the memory based on the difference. The corresponding memory cells of the memory are read with the obtained optimal read voltage, thus greatly increasing the probability of correctly reading the data stored in the memory cell. The operating method provided in the embodiment of the present disclosure is a method for obtaining the optimal read voltage of the memory online. In other words, the operating method is a method of determining the optimal read voltage by using real data generated during the actual operation of the memory, rather than a method of determining the optimal read voltage by using the analog data in the memory production process. The operating method of this application can obtain the optimal read voltage set online to improve the decoding success rate; or obtain the threshold shift method of the optimal read voltage online, selecting the reread voltage more pertinently, and reducing the number of reread, in order to achieve the purpose of saving time.

Based on the same inventive concept, embodiments of the present disclosure also provide a memory, a memory array that includes memory cells; and a peripheral circuit coupled to the memory array and configured to control the memory array, wherein the peripheral circuit is configured to implement any step of the above operating method.

In some embodiments, the peripheral circuit comprises a register for storing the optimal read voltage.

It should be noted that the technical solution described in the memory and the technical solution of the aforementioned operating method belong to the same inventive concept, and both have the same technical features. For a detailed description, the nouns appearing here can be understood in accordance with the meanings of the foregoing descriptions, and will not be repeated here.

The embodiment of the application also provides a memory system, comprising: one or more of the memories according to any one of the above aspects;

and the memory controller coupled to the memory; the memory controller is configured to send a first command to the memory;

the memory is configured to perform the above operating method in response to the first command.

In an embodiment, the first command is used for starting the execution of the operating method, wherein the first command includes commands for instructing the memory to obtain at least one set of read voltages and commands for reading a memory plane respectively using voltage values of the at least one set of read voltages, and other commands for realizing the operating method.

In other embodiments, the embodiment of this application also provides a memory system comprising: one or more memories; and a memory controller coupled to the memory; wherein, The memory controller is configured to obtain at least one set of read voltages; each of the at least one set of read voltages includes an initial voltage value and an offset voltage value with a certain offset relative to the initial voltage value; the initial voltage value in each set of read voltages is a preset read voltage for distinguishing two adjacent memory states of the memory cells of the memory; sending a corresponding read command to a memory plane contained in the memory respectively based on an initial voltage value and an offset voltage value in the at least one set of read voltages;

The memory is configured to read a corresponding memory plane in response to the corresponding read command; sending a reading result of each of memory cells in the memory plane to the memory controller;

The memory controller is further configured to receive the reading result; count the quantity of memory cells in which reading result corresponding to each voltage value meets the set conditions; determine a difference between the two quantities corresponding to every two adjacent voltage values belonging to the same set of read voltages; determine an optimal read voltage for distinguishing the two adjacent memory states based on the difference.

It should be noted that the memory system may implement the implementations of FIG. 14.

In other embodiments, this application also provides a memory system comprises: one or more memories; and a memory controller coupled to the memories; wherein, the memory controller is configured to obtain at least one set of read voltages; each of the at least one set of read voltages includes an initial voltage value and an offset voltage value with a certain offset relative to the initial voltage value; the initial voltage value in each set of read voltages is a preset read voltage for distinguishing two adjacent memory states of the memory cells of the memory; send a corresponding read command to a memory plane contained in the memory respectively based on an initial voltage value and an offset voltage value in the at least one set of read voltages;

the memory is configured to read a corresponding memory plane in response to the corresponding read command; count the quantity of memory cells in which reading result corresponding to each voltage value meets the set conditions; and send the quantity to the memory controller;

the memory controller is further configured to receive the quantity; determine a difference between the two quantities corresponding to every two adjacent voltage values belonging to the same set of read voltages; determine an optimal read voltage for distinguishing the two adjacent memory states based on the difference.

It should be noted that the memory system can implement the implementation shown in FIG. 15.

In some embodiments, any above memory system is a solid-state disk SSD or a memory card.

It should be noted that the memory system herein includes the aforementioned memory, both of which have the same technical characteristics. The structure of the memory and the terms appearing in the technical scheme of the present disclosure have been described in detail, so the terms appearing here can be understood according to the meaning described above and will not be repeated here.

The above description is only a preferred embodiment of the present disclosure and is not intended to limit the scope of protection of the present disclosure.

What is claimed is:

1. An operating method for a memory, the operating method comprising:
   obtaining at least one set of read voltages, each of the at least one set of read voltages comprising an initial voltage value and an offset voltage value with a certain offset relative to the initial voltage value, the initial voltage value in each of the at least one set of read voltages being a preset read voltage for distinguishing two adjacent memory states of one of a plurality of memory cells of the memory;
   performing read operations respectively based on the initial voltage values and the offset voltage values in the at least one set of read voltages, and obtaining a quantity of the memory cells in which a read result corresponding to each voltage value meets set conditions;
   determining a difference between the two quantities corresponding to every two adjacent voltage values belonging to a same set of read voltages; and
   determining an optimal read voltage for distinguishing the two adjacent memory states based on the difference.

2. The operating method of claim 1, wherein obtaining at least one set of read voltages comprises:
   determining at least one initial voltage value;
   sequentially increasing or decreasing by equal offsets to obtain a first offset voltage value with a certain offset relative to a first initial voltage value, based on the first initial voltage value of the at least one initial voltage value;
   obtaining a corresponding set of read voltages based on the first initial voltage value and the first offset voltage value; and
   obtaining the at least one set of read voltages based on each set of the corresponding set of read voltages.

3. The operating method of claim 1, wherein performing read operations respectively based on the initial voltage values and the offset voltage values in the at least one set of read voltages, and obtaining the quantity of the memory cells in which read result corresponding to each voltage value meets the set conditions, comprising:
   reading a memory plane in the memory employing the initial voltage value and the offset voltage value contained in each of the at least one set of read voltages, respectively; and counting the quantity of the memory cells in which read results meet the set conditions contained in the memory plane read by each voltage value.

4. The operating method of claim 1, wherein the at least one set of read voltages comprises a first set of read voltages; and determining an optimal read voltage for distinguishing the two adjacent memory states based on the difference comprises:

determining an offset direction of the optimal read voltage with respect to an initial voltage value in the first set of read voltages when a change trend of the difference is consistent with a change trend of voltage values in the first set of read voltages; and determining the optimal read voltage based on the offset direction and a preset read voltage offset table.

5. The operating method of claim 4, wherein determining an offset direction of the optimal read voltage with respect to an initial voltage value in the first set of read voltages comprises:

determining that the offset direction of the optimal read voltage with respect to the initial voltage value in the first set of read voltages is leftward when the change trend of voltage values in the first set of read voltages is sequentially decreased with respect to the initial voltage value in the first set of read voltages; and determining the offset direction of the optimal read voltage with respect to the initial voltage value in the first set of read voltages is rightward when the change trend of voltage values in the first set of read voltages is sequentially increased with respect to the initial voltage value in the first set of read voltages.

6. The operating method of claim 4, wherein determining the optimal read voltage based on the offset direction and a preset read voltage offset table comprises:

selecting a first optimal offset from the preset read voltage offset table based on the offset direction; and determining the optimal read voltage based on the first optimal offset and the initial voltage value in the first set of read voltages.

7. The operating method of claim 4, further comprising:

determining a minimum one of the differences when the change trend of the differences is inconsistent with the change trend of voltage values in the first set of read voltages; and determining the optimal read voltage based on the minimum difference.

8. The operating method of claim 7, wherein determining the optimal read voltage based on the minimum difference comprises:

determining two adjacent voltage values corresponding to the minimum difference from offset voltage values in the first set of read voltages; and determining an average voltage value of the two adjacent voltage values to be the optimal read voltage.

9. The operating method of claim 4, wherein the at least one set of read voltages further comprises a second set of read voltages, a certain voltage difference is between the initial voltage values in the second set of read voltages and the initial voltage values in the first set of read voltages, offset voltage values in the second set of read voltages and offset voltage values in the first set of read voltages are between the initial voltage values in the second set of read voltages and the initial voltage values in the first set of read voltages, the differences comprises a first sub-difference corresponding to the first set of read voltages and a second sub-difference corresponding to the second set of read voltages, and determining an optimal read voltage for distinguishing the two adjacent memory states based on the difference comprises:

determining the optimal read voltage based on a first change trend of the first sub-difference and/or a second change trend of the second sub-difference; and wherein the initial voltage value in the second set of read voltages is greater or less than the initial voltage value in the first set of read voltages.

10. The operating method of claim 9, wherein determining the optimal read voltage based on a first change trend of the first sub-difference and/or a second change trend of the second sub-difference when the initial voltage value in the first set of read voltages is greater than the initial voltage value in the second set of read voltages comprises:

determining the optimal read voltage based on a minimum one of the first sub-differences when the first change trend is inconsistent with a change trend of a voltage value in the first set of read voltages and the second change trend is consistent with a change trend of a voltage value in the second set of read voltages.

11. The operating method of claim 10, further comprising:

determining the optimal read voltage based on a minimum one of first sub-differences and/or a minimum one of second sub-differences when the first change trend is inconsistent with the change trend of voltage values in the first set of read voltages and the second change trend is inconsistent with the change trend of voltage values in the second set of read voltages.

12. The operating method of claim 10, further comprising:

determining the optimal read voltage based on a minimum one of the second sub-differences when the first change trend is consistent with the change trend of voltage values in the first set of read voltages and the second change trend is inconsistent with the change trend of voltage values in the second set of read voltages.

13. The operating method of claim 10, further comprising:

when the first change trend is consistent with the change trend of voltage values in the first set of read voltages and the second change trend is consistent with the change trend of voltage values in the second set of read voltages, determining a first offset direction of the optimal read voltage with respect to the initial voltage value in the first set of read voltages and determining a second offset direction of the optimal read voltage with respect to the initial voltage value in the second set of read voltages;

determining a second optimal offset from the preset read voltage offset table based on the first offset direction and the second offset direction; and determining the optimal read voltage based on the initial voltage value in the first set of read voltages, the initial voltage value in the second set of read voltages, and the second optimal offset.

14. The operating method of claim 1, wherein the operating method is performed when the memory is idle or during operation of a user.

15. A memory, comprising:

a memory array comprising a memory plane having memory cells; and a peripheral circuit coupled to the memory array, the peripheral circuit being configured to:

obtain at least one set of read voltages, each of the at least one set of read voltages comprising an initial voltage value and an offset voltage value with a certain offset relative to the initial voltage value, the initial voltage value in each of the at least one set of read voltages being a preset read voltage for distinguishing two adjacent memory states of one of the memory cells;

perform read operations respectively based on the initial voltage values and the offset voltage values in the at least one set of read voltages, and obtain a quantity of the memory cells in which a read result corresponding to each voltage value meets the set conditions;

determine a difference between the two quantities corresponding to every two adjacent voltage values belonging to a same set of read voltages; and determine an optimal read voltage for distinguishing the two adjacent memory states based on the difference.

16. The memory of claim 15, wherein the peripheral circuit comprises a register for storing the optimal read voltage.

17. The memory of claim 15, wherein the peripheral circuit is configured to obtain at least one set of read voltages by:

determining at least one initial voltage value;

sequentially increasing or decreasing by equal offsets to obtain a first offset voltage value with a certain offset relative to a first initial voltage value, based on the first initial voltage value of the at least one initial voltage value;

obtaining a corresponding set of read voltages based on the first initial voltage value and the first offset voltage value; and obtaining the at least one set of read voltages based on each set of the corresponding set of read voltages.

18. The memory of claim 15, wherein the peripheral circuit is configured to perform the read operations respectively based on the initial voltage values and the offset voltage values in the at least one set of read voltages, and obtain a quantity of the memory cells in which the read result corresponding to each voltage value meets the set conditions by:

reading the memory plane by employing the initial voltage value and the offset voltage value contained in each of the at least one set of read voltages, respectively; and counting the memory cells in which read results meet the set conditions contained in the memory plane read by each voltage value.

19. The memory of claim 15, wherein the at least one set of read voltages comprises a first set of read voltages, and the peripheral circuit is configured to determine the optimal read voltage for distinguishing the two adjacent memory states based on the difference by:

determining an offset direction of the optimal read voltage with respect to an initial voltage value in the first set of read voltages when a change trend of the difference is consistent with a change trend of voltage values in the first set of read voltages; and determining the optimal read voltage based on the offset direction and a preset read voltage offset table.

20. A memory system, comprising:

one or more of memories; and a memory controller coupled to the one or more of memories and configured to send a first command to the one or more of memories;

wherein each of the one or more of memories comprises:

a memory array comprising memory cells; and a peripheral circuit coupled to the memory array, the peripheral circuit being configured to:

in response to the first command and obtain at least one set of read voltages, each of the at least one set of read voltages comprising an initial voltage value and an offset voltage value with a certain offset relative to the initial voltage value, the initial voltage value in each of the at least one set of read voltages being a preset read voltage for distinguishing two adjacent memory states of one of the memory cells;

perform read operations respectively based on the initial voltage values and the offset voltage values in the at least one set of read voltages, and obtain a quantity of the memory cells in which a read result corresponding to each voltage value meets the set conditions;

determine a difference between the two quantities corresponding to every two adjacent voltage values belonging to a same set of read voltages; and determine an optimal read voltage for distinguishing the two adjacent memory states based on the difference.

* * * * *